(12) United States Patent
Yang et al.

(10) Patent No.: US 9,653,281 B2
(45) Date of Patent: May 16, 2017

(54) STRUCTURE AND METHOD FOR TUNABLE MEMORY CELLS INCLUDING FIN FIELD EFFECT TRANSISTORS

(71) Applicant: QUALCOMM Incorporated, San Diego, CA (US)

(72) Inventors: Haining Yang, San Diego, CA (US); Yanxiang Liu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/746,606

(22) Filed: Jun. 22, 2015

(65) Prior Publication Data

US 2016/0372316 A1 Dec. 22, 2016

(51) Int. Cl.
| | |
|---|---|
| *H01L 27/02* | (2006.01) |
| *H01L 21/02* | (2006.01) |
| *G05B 19/418* | (2006.01) |
| *H01L 27/11* | (2006.01) |
| *H01L 21/8234* | (2006.01) |
| *H01L 21/8238* | (2006.01) |
| *H01L 21/84* | (2006.01) |
| *H01L 29/78* | (2006.01) |
| *H01L 27/088* | (2006.01) |
| *H01L 27/092* | (2006.01) |
| *H01L 27/12* | (2006.01) |

(52) U.S. Cl.
CPC ............ *H01L 21/02* (2013.01); *G05B 19/418* (2013.01); *H01L 21/823431* (2013.01); *H01L 21/823821* (2013.01); *H01L 21/845* (2013.01); *H01L 27/0207* (2013.01); *H01L 27/0886* (2013.01); *H01L 27/0924* (2013.01); *H01L 27/11* (2013.01); *H01L 27/1104* (2013.01); *H01L 27/1211* (2013.01); *H01L 29/785* (2013.01); *G05B 2219/45031* (2013.01)

(58) Field of Classification Search
CPC ...... H01L 27/02; H01L 27/11; H01L 27/1104; H01L 27/0207; H01L 27/088; H01L 27/0886; H01L 27/12; H01L 27/0924; H01L 27/1211; H01L 27/092; H01L 27/112; H01L 29/785; H01L 29/78; H01L 27/11206; H01L 23/525; H01L 23/5256
USPC ......................................... 257/401, 351, 369
See application file for complete search history.

(56) References Cited

U.S. PATENT DOCUMENTS

| | | | |
|---|---|---|---|
| 7,522,445 | B2 | 4/2009 | Inaba |
| 7,737,501 | B2 | 6/2010 | Zhu et al. |
| 8,561,003 | B2 | 10/2013 | Kawa et al. |

(Continued)

FOREIGN PATENT DOCUMENTS

WO 2015033491 A1 3/2015

OTHER PUBLICATIONS

International Search Report and Written Opinion—PCT/US2016/036084—ISA/EPO—Aug. 18, 2016.

*Primary Examiner* — Chuong A Luu

(57) ABSTRACT

In a particular aspect, an integrated circuit includes a first gate structure coupled to a first fin field effect transistor (FinFET) device. The integrated circuit includes a second gate structure coupled to a second FinFET device. The first gate structure and the second gate structure are separated by a dielectric region. The integrated circuit further includes a metal contact having a first surface that is in contact with the dielectric region, the first gate structure, and the second gate structure.

20 Claims, 11 Drawing Sheets

(56) References Cited

U.S. PATENT DOCUMENTS

| | | |
|---|---|---|
| 8,779,528 B2 | 7/2014 | Liaw |
| 2007/0257277 A1* | 11/2007 | Takeda .................... H01L 27/11 257/204 |
| 2012/0327705 A1* | 12/2012 | Chen ..................... G11C 11/412 365/156 |
| 2013/0242633 A1 | 9/2013 | Liaw |
| 2014/0299936 A1* | 10/2014 | Zhang ................. H01L 27/1211 257/348 |
| 2015/0008533 A1 | 1/2015 | Liaw |
| 2016/0189756 A1 | 6/2016 | Koike et al. |

\* cited by examiner

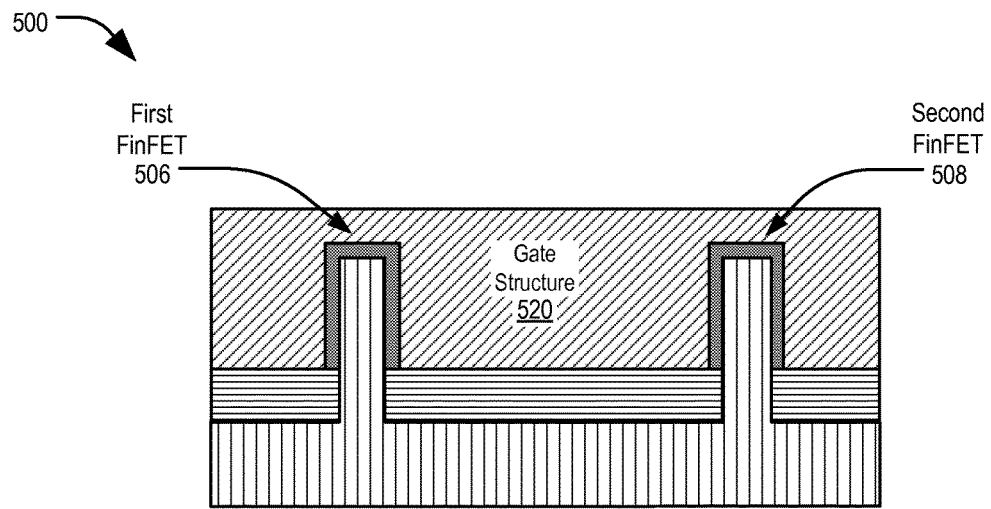
FIG. 5A
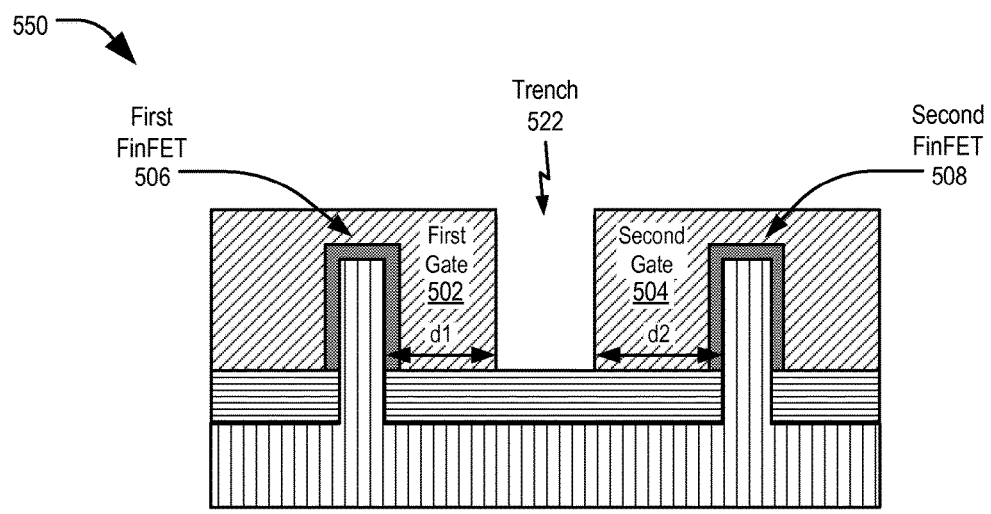
FIG. 5B
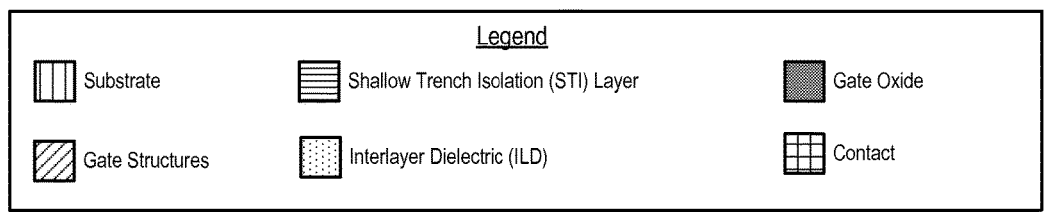

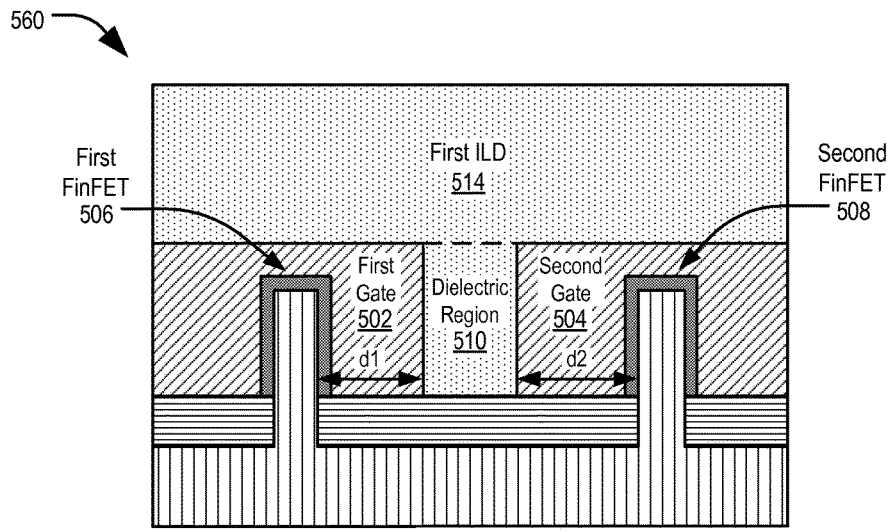
FIG. 5C
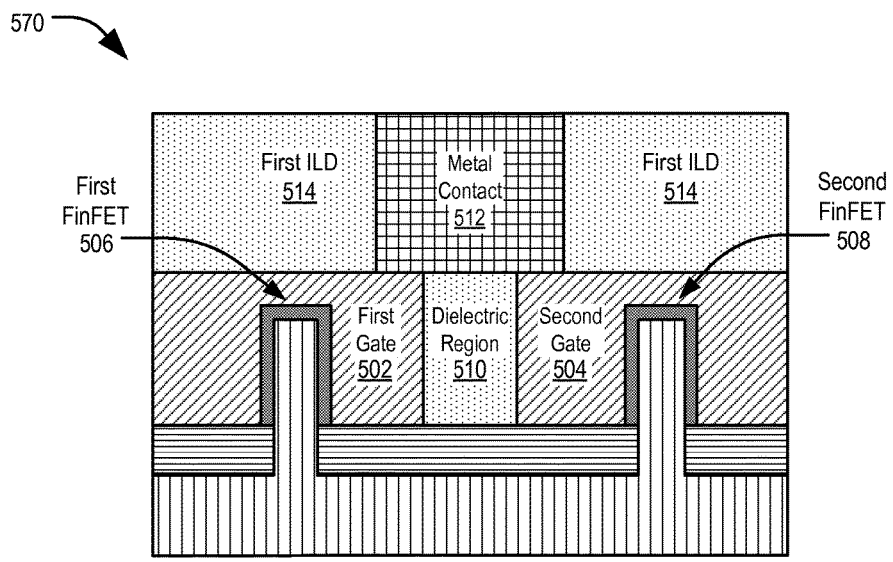
FIG. 5D
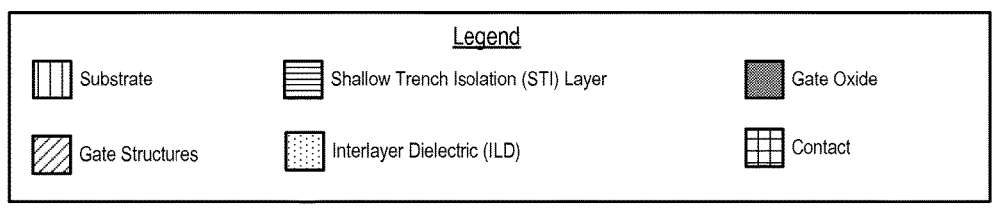

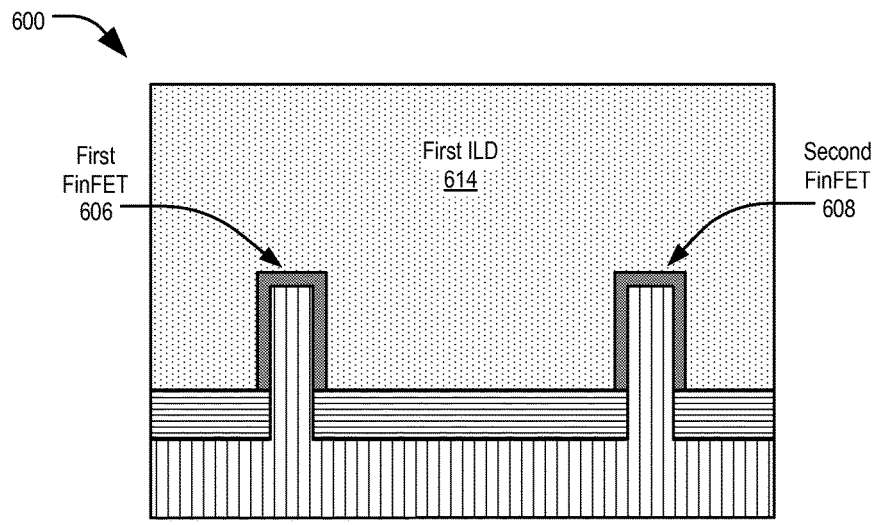
*FIG. 6A*
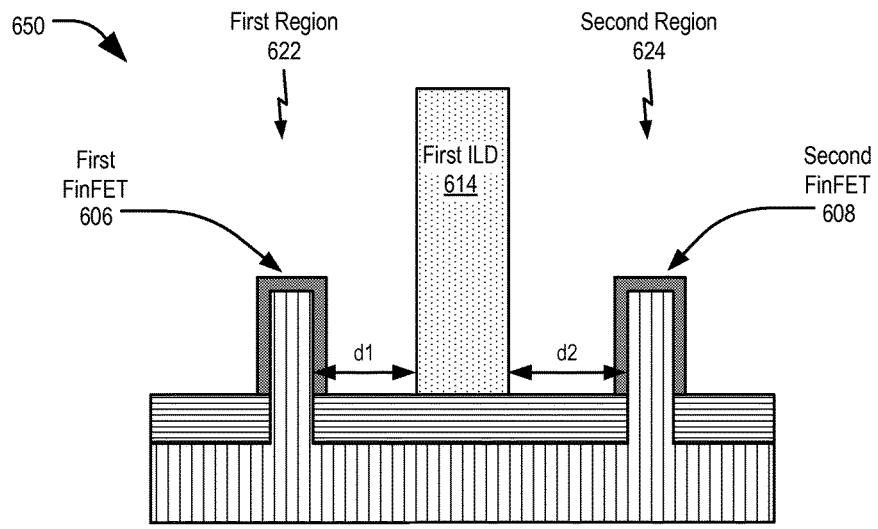
*FIG. 6B*
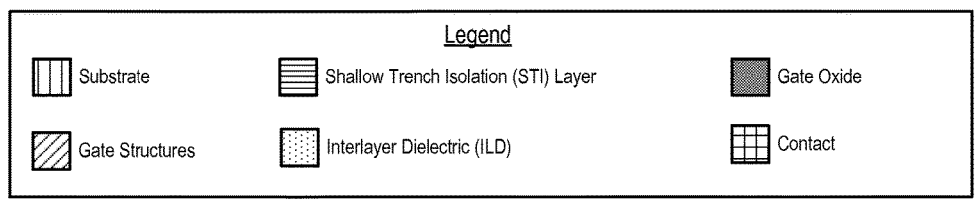

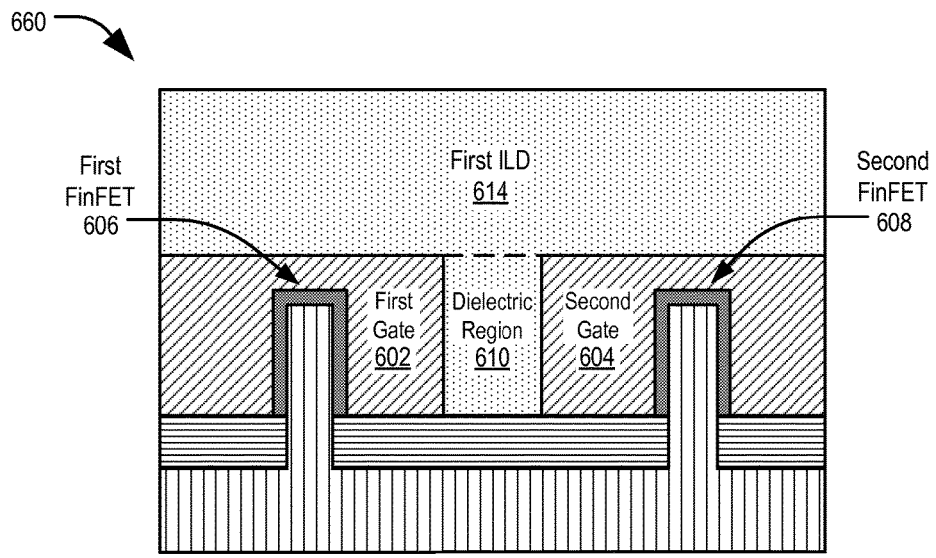
*FIG. 6C*
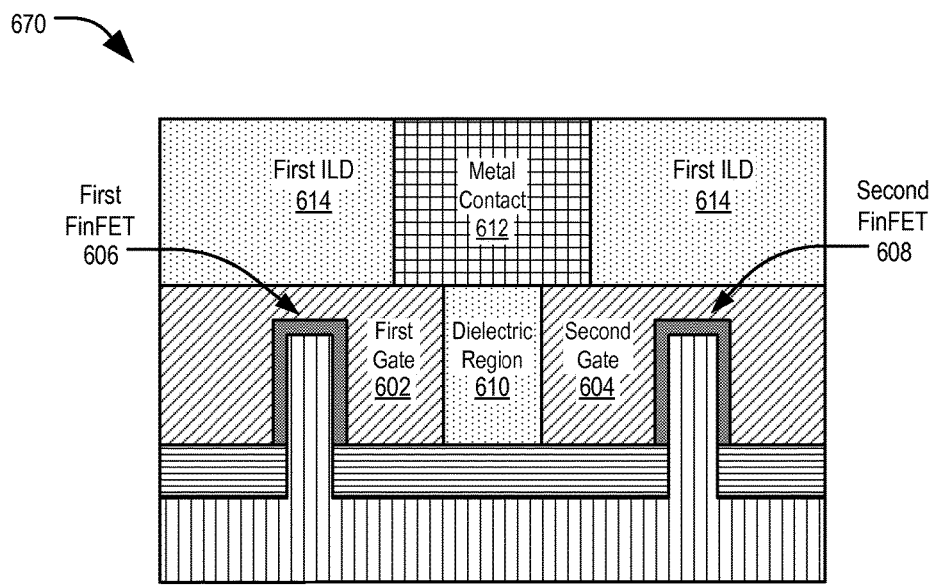
*FIG. 6D*
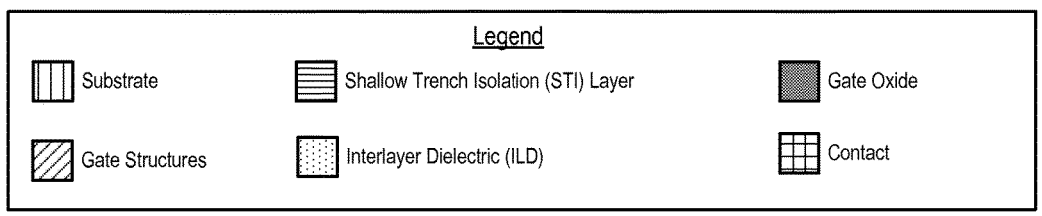

STRUCTURE AND METHOD FOR TUNABLE MEMORY CELLS INCLUDING FIN FIELD EFFECT TRANSISTORS

I. FIELD

The present disclosure is generally related to memory cells that include fin field-effect transistors.

II. DESCRIPTION OF RELATED ART

Advances in technology have resulted in smaller and more powerful computing devices. For example, a variety of portable personal computing devices, including wireless telephones such as mobile and smart phones, tablets and laptop computers are small, lightweight, and easily carried by users. These devices can communicate voice and data packets over wireless networks. Further, many such devices incorporate additional functionality such as a digital still camera, a digital video camera, a digital recorder, and an audio file player. Also, such devices can process executable instructions, including software applications, such as a web browser application, that can be used to access the Internet. As such, these devices can include significant computing and networking capabilities.

Wireless devices may include static random access memory (SRAM) devices to store data or instructions. Functionality of memory cells (e.g., bit cells) of SRAM devices may be based on drive strengths of transistors in the memory cells. For example, in a conventional SRAM cell that includes two pass-gate transistors, two pull-up transistors, and two pull-down transistors (e.g., a six transistor (6T) SRAM cell), stability and writability of the SRAM cell depend on ratios of drive strengths of the transistors, such as an alpha ($\alpha$) ratio, a beta ratio ($\beta$), and/or a gamma ($\gamma$) ratio. For a planar transistor, the drive strength is based on transistor width. During design of an SRAM cell that includes planar transistors, the SRAM cell may be "tuned" by selecting widths of the transistors in order to achieve one or more target drive strength ratios. For a fin field-effect transistor (FinFET), the drive strength is based on a number of fins included in the FinFET. A ratio of drive strengths between two transistors (e.g., between a pull-up transistor and a pass-gate transistor) may be an integer ratio, such as 1:2, 1:3, or 2:3. The number of fins of a FinFET is limited to integers, therefore tuning an SRAM cell by selecting the number of fins included in FinFETs may provide only coarse tuning for the SRAM cell. This coarse tuning may not be sufficient to achieve a particular drive strength ratio associated with a target stability or a target writability of an SRAM cell.

III. SUMMARY

The present disclosure provides integrated circuits, such as static random access memory (SRAM) cells, that include fin field-effect transistors (FinFETs) having drive strengths that are capable of achieving target drive strength ratios that are not achievable by other SRAM cells. In the present disclosure, certain transistors (e.g., pass-gate transistors of neighboring SRAM cells or a pull-up transistor and a pull-down transistor of the same SRAM cell) are coupled to separate gate structures, and the separate gate structures are coupled to a metal contact. To illustrate, a first FinFET is coupled to a first gate structure, a second FinFET is coupled to a second gate structure, and the first gate structure and the second gate structure are separated by a dielectric region. In a particular aspect, a single gate structure that is coupled to two FinFETs is cut during a fabrication process to form a first gate structure and a second gate structure that are separated by a dielectric region. In an alternate aspect, the first gate structure and the second gate structure are formed individually during a fabrication process and are separated by the dielectric region. In both aspects, the first gate structure is coupled to the second gate structure by a metal contact having a surface that is in contact with the dielectric region, the first gate structure, and the second gate structure. For example, a bottom surface of the metal may be in contact with the dielectric region, a portion of the first gate structure, and a portion of the second gate structure. The metal contact may be included in a contact layer that is distinct from other metal layers (e.g., a metal-0 layer, a metal-1 layer, a metal-2 layer, etc.) and thus the metal contact is not included in a higher metal layer.

The drive strengths of the FinFETs of the present disclosure may be more finely tuned during a design process than FinFETs of conventional SRAM cells. For example, in other SRAM cells, FinFETs are coupled to a single gate structure, and the drive strengths of the FinFETs are tuned by selecting a number of fins in the FinFETs. Thus, drive strength ratios between FinFETs are limited to integer ratios (e.g., 1:2, 1:3, 2:3, etc.). In the present disclosure, drive strengths of the FinFETs may be tuned during the design process by selection of the number of fins and by selection of the position and width of the dielectric region. For example, an n-channel metal-oxide-semiconductor (NMOS) FinFET that is nearer to the dielectric region may have an increased drive strength as compared to an NMOS FinFET that is farther from the dielectric region. As another example, a p-channel metal-oxide-semiconductor (PMOS) FinFET that is nearer to the dielectric region may have a reduced drive strength as compared to a PMOS FinFET that is farther from the dielectric region. By selecting a width and location of the dielectric region (relative to the FinFETs) during the design process, target drive strengths of the FinFETs may be achieved. The target drive strengths may be associated with drive strength ratios that are non-integer ratios, such as fractional drive strength ratios (e.g., 3/2:1, 2/3:2, etc.) that are associated with a target stability or a target writability of one or more memory cells that include the FinFETs, the traditional drive strength ratios are not achievable by only selecting the number of fins in the FinFETs.

In a particular aspect, an integrated circuit includes a first gate structure coupled to a first fin field effect transistor (FinFET) device. The integrated circuit includes a second gate structure coupled to a second FinFET device. The first gate structure and the second gate structure are separated by a dielectric region. The integrated circuit further includes a metal contact having a first surface that is in contact with the dielectric region, the first gate structure, and the second gate structure. The first gate structure is coupled to the second gate structure by the metal contact.

In a particular aspect, a method of fabricating an integrated circuit includes forming a first gate structure over a first fin field effect transistor (FinFET) device. The method includes forming a second gate structure over a second FinFET device. The method includes depositing a dielectric material in a region between the first FinFET device and the second FinFET device to form a dielectric region. The first gate structure and the second gate structure are separated by the dielectric region. The method further includes forming a metal contact having a surface that is in contact with the dielectric region, the first gate structure, and the second gate structure.

In a particular aspect, an apparatus includes means for storing a data value. The means for storing a data value includes a first fin field effect transistor (FinFET) device. The first FinFET device is coupled to a first gate structure. The first gate structure and a second gate structure coupled to a second FinFET device are separated by a dielectric region. The apparatus further includes means for electrically coupling the first gate structure to the second gate structure. The means for electrically coupling has a surface that is in contact with the dielectric region, the first FinFET device, and the second FinFET device.

In another particular aspect, a non-transitory computer-readable medium stores instructions that, when executed by a processor, cause the processor to initiate formation of a first gate structure over a first fin field effect transistor (FinFET) device. The instructions cause the processor to initiate formation of a second gate structure over a second FinFET device. The instructions cause the processor to initiate deposition of a dielectric material in a region between the first FinFET device and the second FinFET device to form a dielectric region. The first gate structure and the second gate structure are separated by the dielectric region. The instructions further cause the processor to initiate formation of a metal contact having a surface that is in contact with the dielectric region, the first gate structure, and the second gate structure.

One particular advantage provided by at least one of the disclosed aspects is one or more memory cells that include FinFETs and that are tunable during a design process to achieve target stability values and/or target writability values. For example, by selecting a width and a location of the dielectric region during a design process, the drive strengths of the FinFETs may be more finely tuned than the "coarse" tuning provided by selecting the number of fins in the FinFETs. Through the fine tuning, drive strength ratios that are fractional ratios may be achieved. In this manner, the one or more memory cells may achieve drive strength ratios associated with target stability values and/or target writability values.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

Figure 1:
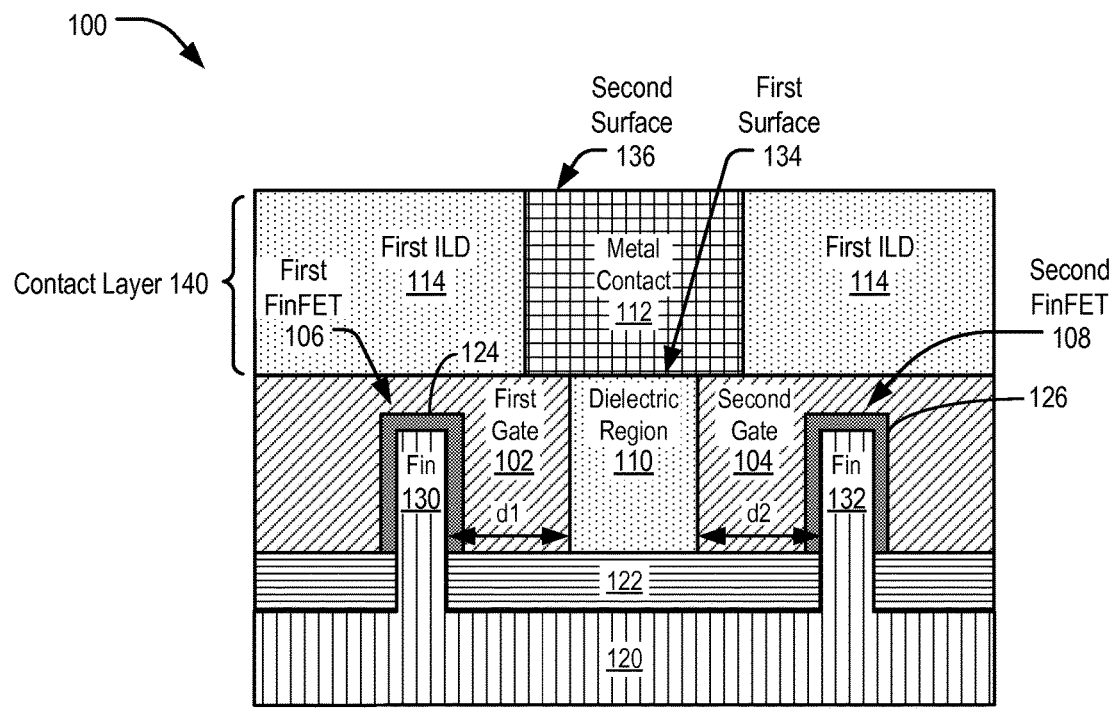
FIG. 1 is a diagram of an integrated circuit having gate structures that are separated by a dielectric region and that are electrically coupled by a metal contact.
Figure 1:
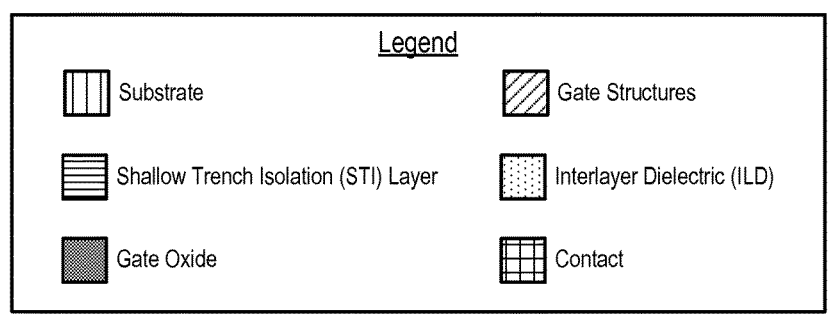
Figure 7:
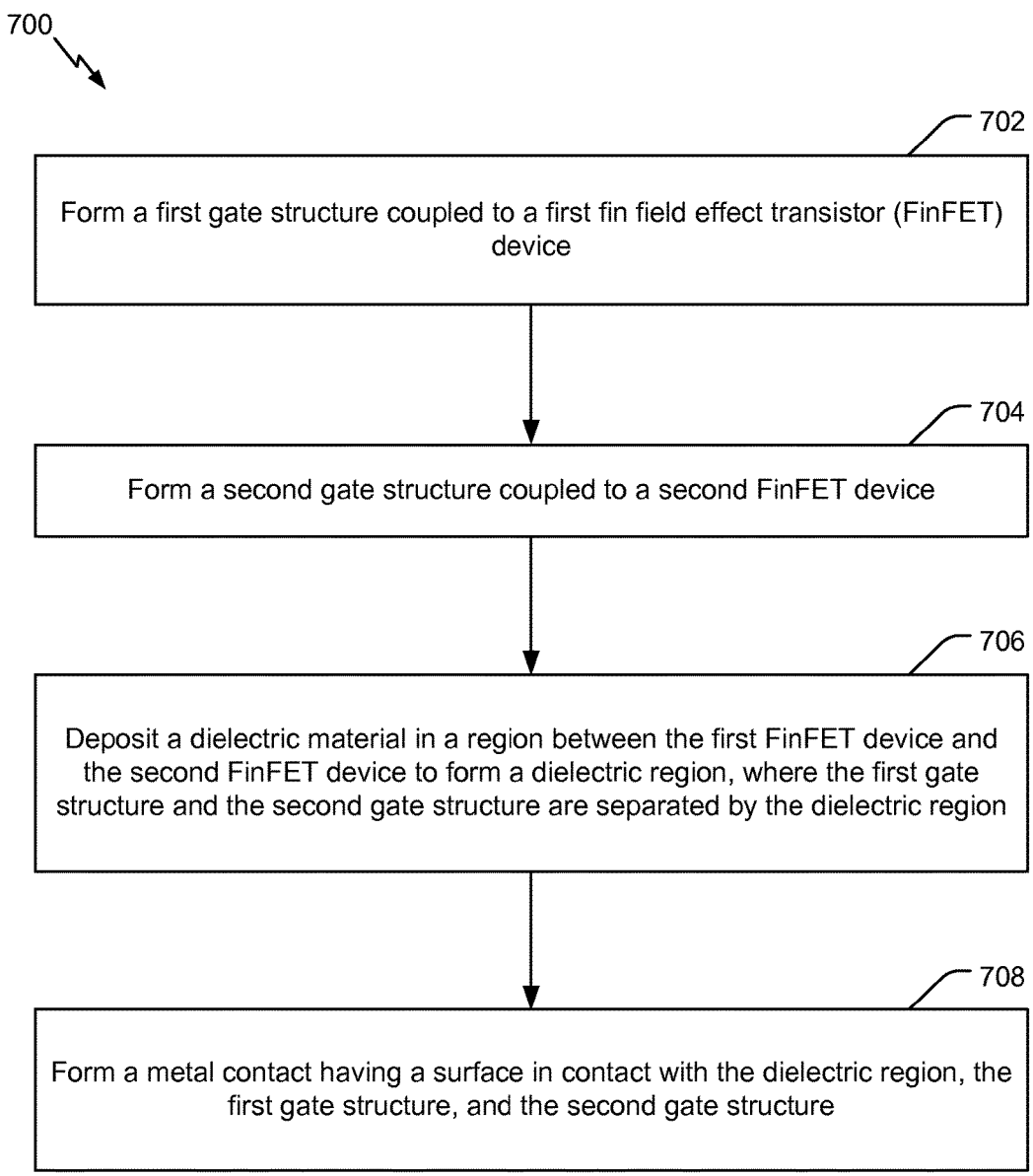
Figure 8:
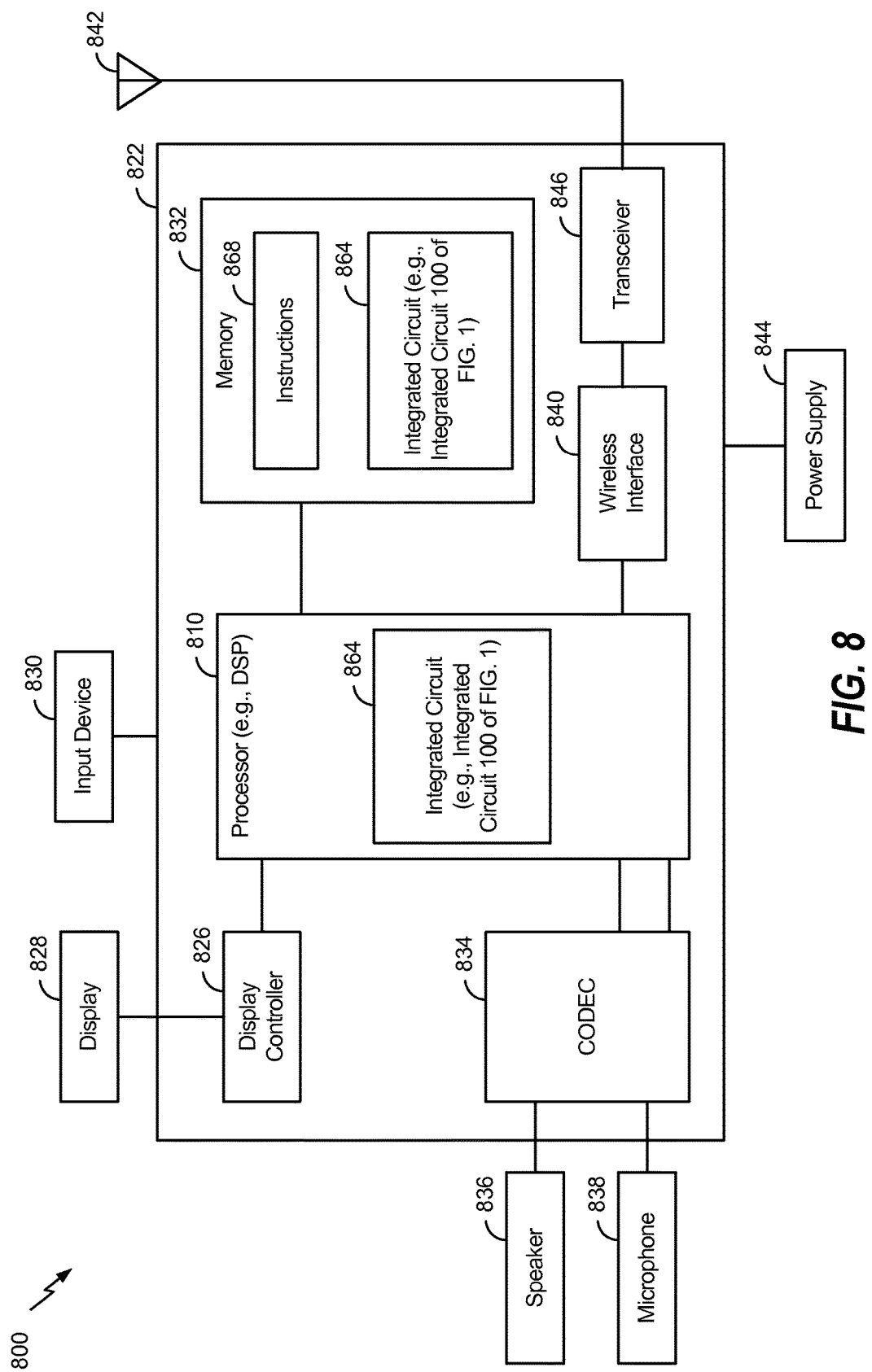
Figure 9:
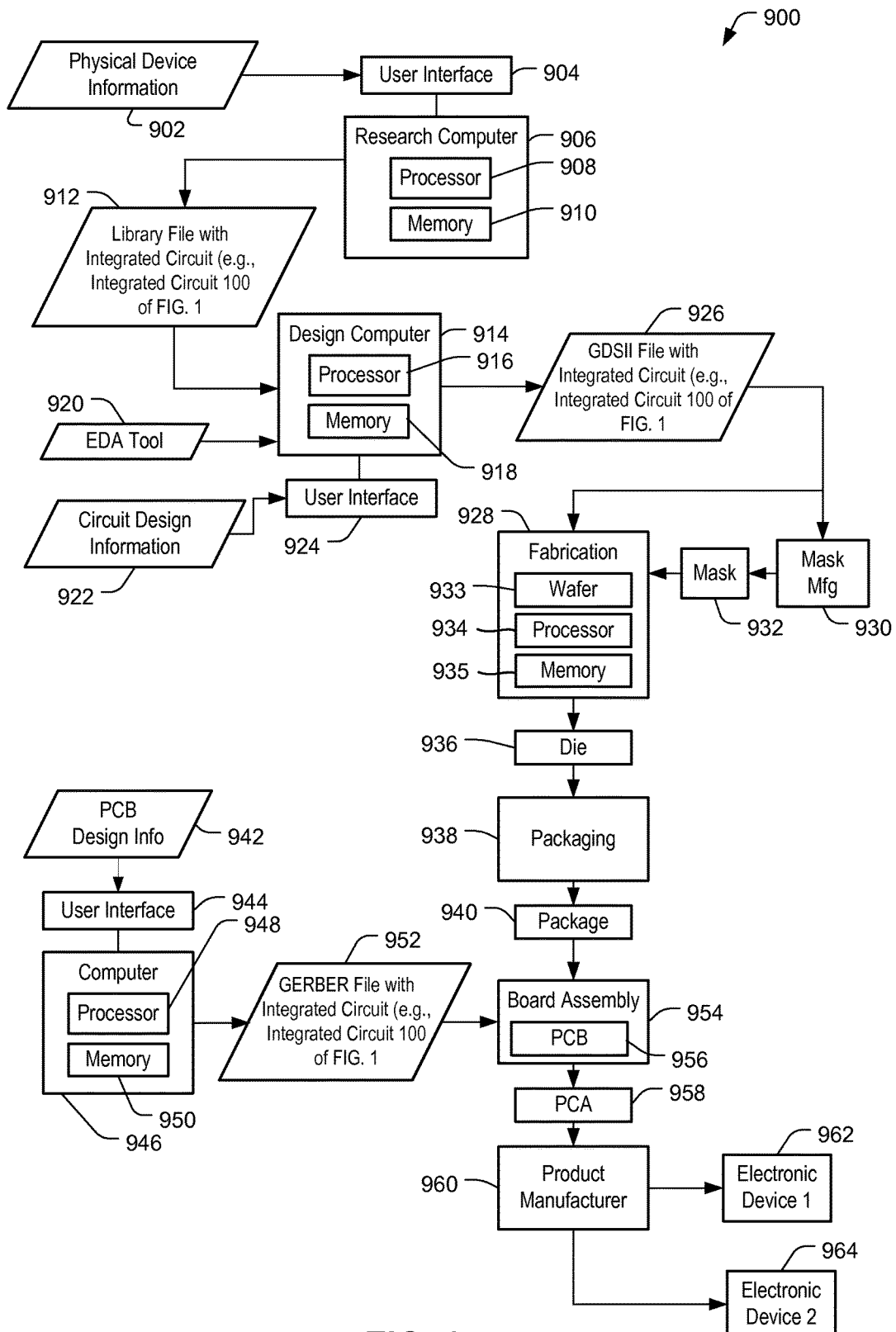

FIGS. 5A-D are diagrams of an illustrative example of a first process flow of fabricating the integrated circuit of FIG. 1;

FIGS. 6A-D are diagrams of an illustrative example of a second process flow of fabricating the integrated circuit of FIG. 1;

FIG. 7 is a flow chart that illustrates a method of fabricating an integrated circuit that includes gate structures that are separated by a dielectric region and that are electrically connected by a metal contact;

FIG. 8 is a block diagram of a device including the integrated circuit of FIG. 1; and FIG. 9 is a data flow diagram of an illustrative aspect of a manufacturing process to fabricate a device including the integrated circuit of FIG. 1.

V. DETAILED DESCRIPTION

Particular aspects of the present disclosure are described below with reference to the drawings. In the description, common features are designated by common reference numbers throughout the drawings.

The present disclosure describes integrated circuits that include fin field-effect transistors (FinFETs) that are coupled to gate structures. The gate structures may be separated by a dielectric region, and a metal contact may electrically couple the gate structures together. The metal contact has a surface that is in contact with the dielectric region, the first gate structure, and the second gate structure (e.g., the metal contact is not in a higher metal layer of an integrated circuit). A width of the dielectric region and a position of the dielectric region relative to the gate structures may be selected during a design process to cause the FinFETs to have drive strengths that achieve drive strength ratios associated with a target stability value and/or a target writability value of one or more memory cells that include the FinFETs.

Referring to FIG. 1, an integrated circuit 100 having gate structures that are separated by a dielectric region and that are electrically coupled by a metal contact is depicted. As illustrated in FIG. 1, the integrated circuit 100 includes a first gate structure 102 coupled to a first FinFET device 106 and a second gate structure 104 coupled to a second FinFET device 108. The first gate structure 102 and the second gate structure 104 are separated by a dielectric region 110. The integrated circuit 100 also includes a metal contact 112 that electrically couples the first gate structure 102 to the second gate structure 104. The metal contact 112 has a first surface 134 (e.g., a bottom surface) that is in contact with (e.g., abuts) the dielectric region 110, a portion of the first gate structure 102, and a portion of the second gate structure 104. If the integrated circuit 100 is oriented as illustrated in FIG. 1, the metal contact 112 may be referred to as being "above" the dielectric region.

The first FinFET device 106 and the second FinFET device 108 may include FinFET transistors formed on a substrate 120. In a particular implementation, the substrate 120 includes silicon (Si). A shallow trench isolation (STI) layer 122 may be formed on the substrate 120, and the substrate 120 may include one or more active areas or regions (not illustrated), such as source regions and drain regions. The first FinFET device 106 may include a first source region, a first drain region, and a fin 130. The fin 130 may extend from the substrate 120 and may form a channel between the first source region and the first drain region. The second FinFET device 108 may include a second source region, a second drain region, and a fin 132. The fin 132 may extend from the substrate 120 and may form a channel between the second source region and the second drain region. In some implementations, the first FinFET device 106 includes a gate oxide layer 124 that is formed on and around the fin 130 and the second FinFET device 108 includes a gate oxide layer 126 that is formed on and around the fin 132.

The first gate structure 102 may be formed on (e.g., surrounding) at least a portion of the fin 130 of the first FinFET device 106 and may be configured to selectively enable current to flow through the channel (e.g., the fin 130)

based on an applied voltage. Additionally, the second gate structure 104 may be formed on (e.g., surrounding) at least a portion of the fin 132 of the second FinFET device 108 and may be configured to selectively enable current to flow through the channel (e.g., the fin 132) based on an applied voltage. Forming the gate structures 102 and 104 "on" the fins 130 and 132, respectively, may refer to forming the gate structures 102 and 104 directly on the fins 130 and 132 or forming the gate structures 102 and 104 on the gate oxide layers 124 and 126. In a particular implementation, the first gate structure 102 and the second gate structure 104 include or correspond to gate electrodes. The first gate structure 102 and the second gate structure 104 may also be referred to as "poly-gates" or "poly conductors." The first gate structure 102 and the second gate structure 104 may include a conductive gate material. For example, the first gate structure 102 and the second gate structure 104 may include polysilicon, tantalum nitride (TaN), and/or titanium nitride (TiN), as illustrative, non-limiting examples. In a particular implementation, a single gate structure may be formed on the first FinFET device 106 and on the second FinFET device 108, and a cut may be performed on the single gate structure to form the first gate structure 102 and the second gate structure 104, as further described with reference to FIGS. 5A-D. In an alternate implementation, the first gate structure 102 and the second gate structure 104 may be formed individually, as further described with reference to FIGS. 6A-D.

The first gate structure 102 and the second gate structure 104 are separated by the dielectric region 110. The dielectric region 110 may include a dielectric material, such as a high-k dielectric. In a particular implementation, the dielectric region 110 includes the same dielectric material as a first interlayer dielectric (ILD) 114.

The metal contact 112 electrically couples the first gate structure 102 and the second gate structure 104. The metal contact 112 may include a metal, such as copper (Cu), aluminum (Al), tungsten (W), and/or tantalum (Ta), as illustrative, non-limiting examples. The metal contact 112 may be included in a contact layer 140. The contact layer 140 may be between an active area layer (e.g., a layer that includes the gate structures 102 and 104, the fins 130 and 132, the source regions, and drain regions) and higher metal layers (e.g., a metal-0 layer, a metal-1 layer, a metal-2 layer, etc.), as further described with reference to FIGS. 2 and 3. The metal contact 112 is not included in the higher metal layers. Additionally, the contact layer 140 may include the first ILD 114 surrounding the metal contact 112 and any other metal structures (e.g., contacts) in the contact layer 140.

As illustrated in FIG. 1, the first surface 134 (e.g., a bottom surface) of the metal contact 112 is in contact with (e.g., abuts) the dielectric region 110, a portion of the first gate structure 102, and a portion of the second gate structure 104. For example, the first surface 134 may be adjacent to and may be in contact with the dielectric region 110, a portion of the first gate structure 102, and a portion of the second gate structure 104. A second surface 136 (e.g., a top surface) of the metal contact 112 that is opposite to the first surface 134 may be adjacent to a via, as described with reference to FIG. 2, or adjacent to a second interlayer dielectric layer, as further described with reference to FIG. 3.

The first gate structure 102, the second gate structure 104, the metal contact 112, the first FinFET device 106, and the second FinFET device 108 may be included in a static random access memory (SRAM) device. For example, the first FinFET device 106 may be included in a first SRAM cell of an SRAM device, and the second FinFET device 108 may be included in the first SRAM cell or in a second SRAM cell of the SRAM device. In a particular implementation, the SRAM cells may include six transistor SRAM (6T SRAM) cells. For example, a 6T SRAM cell may include two pass-gate transistors, two pull-up transistors, and two pull-down transistors. The first FinFET device 106 may be one of the transistors of a first SRAM cell, and the second FinFET device 108 may be one of the transistors of the first SRAM cell or a transistor of a second SRAM cell. In other implementations, SRAM cells may include more than six or fewer than six transistors, and the FinFET devices 106 and 108 may be included in the SRAM cells.

In a particular implementation, the first FinFET device 106 and the second FinFET device 108 include pass-gate transistors, as further described with reference to FIG. 2. In this implementation, the first FinFET device 106 is included in a first SRAM cell and the second FinFET device 108 is included in a second SRAM cell (e.g., a neighboring cell) that is adjacent to the first SRAM cell. In an alternate implementation, the first FinFET device 106 includes a pull-up transistor and the second FinFET device 108 includes a pull-down transistor. In this implementation, the first FinFET device 106 and the second FinFET device 108 are included in the same SRAM cell.

Because the first gate structure 102 and the second gate structure 104 are separated by the dielectric region 110 and are electrically coupled by the metal contact 112, the first FinFET device 106 and the second FinFET device 108 may have drive strengths (e.g., conductive strengths) that are different than drive strengths of two FinFETs that are electrically coupled to a single gate structure. For example, separating the gate structures 102 and 104 by the dielectric region 110 and electrically coupling the gate structures 102 and 104 by the metal contact 112 may cause gate stress to be applied to the channels of the FinFET devices 106 and 108.

The gate stress may induce tensile strain in a channel of a FinFET, which affects the drive strength of the FinFET. For example, inducing tensile strain in a channel of an n-channel metal-oxide-semiconductor (NMOS) FinFET increases carrier mobility in the channel and increases a drive strength of the NMOS FinFET. As another example, inducing tensile strain in a channel of a p-channel metal-oxide-semiconductor (PMOS) FinFET reduces carrier mobility in the channel and reduces a drive strength of the PMOS FinFET.

In other SRAM cells (e.g., SRAM cells including two FinFETs coupled to a single gate structure), drive strengths of FinFETs are based on a number of fins of the FinFETs. In the present disclosure, drive strengths of the FinFET devices 106 and 108 are based on a number of fins of the FinFETs and based on transistor types (e.g., NMOS or PMOS) of the FinFET devices 106 and 108 and distances between the FinFET devices 106 and 108 and the dielectric region 110. To illustrate, a drive strength of the first FinFET device 106 may be based on a transistor type of the first FinFET device 106 and a distance d1 between the first FinFET device 106 and the dielectric region 110 in addition to a number of fins of the first FinFET device 106. For example, a small distance d1 may increase a drive strength of an NMOS transistor and may decrease a drive strength of a PMOS transistor. As another example, a large distance d1 may decrease a drive strength of an NMOS transistor and may increase a drive strength of a PMOS transistor. Similarly, a drive strength of the second FinFET device 108 may be based on a transistor type of the second FinFET device 108 and a distance d2 between the second FinFET device 108 and the dielectric region 110 in addition to a number of fins of the second FinFET device 108.

During a design process of the integrated circuit 100, one or more SRAM cells that include the first FinFET device 106 and the second FinFET device 108 may be "tuned" to achieve drive strength ratios associated with target stability values and/or target writability values of the one or more SRAM cells. For example, one or more design characteristics of the first FinFET device 106, the second FinFET device 108, the first gate structure 102, the second gate structure 104, the dielectric region 110, and the metal contact 112 may be selected during the design process to cause the FinFET devices 106 and 108 to have particular drive strengths. In a particular implementation, the particular drive strengths are selected to achieve a particular beta ($\beta$) ratio (a ratio of the drive strength of pull-down transistors to the drive strength of pass-gate transistors) For example, as a beta ratio increases, a stability value of an SRAM cell increases, and as the beta ratio decreases, a writability value of the SRAM cell increases. In other implementations, the drive strengths may be selected to achieve a particular alpha ($\alpha$) ratio (a ratio of the drive strength of pull-up transistors to the drive strength of pass-gate transistors) and/or a particular gamma ($\gamma$) ratio (a ratio of the drive strength of pass-gate transistors to the drive strength of pull-up transistors) associated with a target stability value and/or a target writability value.

To achieve a target stability value and/or a target writability value, FinFETs (e.g., the first FinFET device 106 and the second FinFET device 108) of the one or more SRAM cells may be designed to have particular drive strengths. For example, during the design process, the number of fins of the first FinFET device 106 and the number of fins of the second FinFET device 108 may be selected such that the first FinFET device 106 and the second FinFET device 108 have particular drive strengths. Selecting the number of fins of FinFETs may be referred to as "coarse tuning." However, selecting the number of fins may not be sufficient to achieve some target drive strength ratios, such as fractional (i.e. non-integer) drive strength ratios, because the number of fins are integers, and thus the drive strength ratios are based on integer ratios (e.g., 1:2, 1:3, and 2:3, as non-limiting examples). Additionally, FinFETs that include multiple fins may take up more area than FinFETs that include one or a small number of fins. Thus, to reduce a size of the integrated circuit 100, a number of fins of the FinFETs may be limited (e.g., to one or to a small number).

To further tune the one or more SRAM cells, characteristics of the first gate structure 102, the second gate structure 104, the dielectric region 110, and/or the metal contact 112 may be selected during the design process. As explained above, separating the first gate structure 102 and the second gate structure 104 by the dielectric region 110 and coupling the first gate structure 102 to the second gate structure 104 using the metal contact 112 may affect the drive strengths of the first FinFET device 106 and the second FinFET device 108. Additional tuning of the drive strengths of the FinFET devices 106 and 108 may be performed (during a design process) by selecting a width of the dielectric region 110 (or widths of the gate structures 102 and 104) and a position of the dielectric region 110 relative to the gate structures 102 and 104. For example, the width of the dielectric region 110 (or the widths of the gate structures 102 and 104) may be selected during the design process to set the distances d1 and d2 to values associated with target drive strengths of the first FinFET device 106 and the second FinFET device 108.

Accordingly, a target drive strength of the first FinFET device 106, a target drive strength of the second FinFET device 108, or a combination thereof, is based on the width of the dielectric region 110. Additionally, the position of the dielectric region 110 may be selected during the design process to set the distances d1 and d2 to values associated with target drive strengths of the first FinFET device 106 and the second FinFET device 108. Accordingly, a target drive strength of the first FinFET device 106, a target drive strength of the second FinFET device 108, or a combination thereof, is based on the position of the dielectric region 110. To illustrate, a drive strength of an NMOS FinFET device having the distance d1 of 0.035 micrometers ($\mu$m) may be approximately 20% to 55% greater than a drive strength of an NMOS FinFET having the distance d1 of 0.326 $\mu$m. As another example, a drive strength of a PMOS FinFET having the distance d1 of 0.035 $\mu$m may be approximately 20% to 55% less than a drive strength of a PMOS FinFET having the distance d1 of 0.326 $\mu$m. A width of the metal contact 112 may be selected to be greater than the width of the dielectric region 110 so that the first surface 134 of the metal contact 112 abuts the dielectric region 110, a portion of the first gate structure 102 and, a portion of the second gate structure 104.

Thus, setting the distances d1 and d2 (by selecting the position and the width of the dielectric region 110) and selecting the number of fins during the design process may achieve target drive strengths of the FinFET devices 106 and 108 that are not achievable only by selecting the number of fins of the FinFET devices 106 and 108. For example, by setting the distances d1 and d2 and selecting the number of fins of the FinFET devices 106 and 108, a ratio of the drive strength of the first FinFET device 106 to the drive strength of the second FinFET device 108 may be a fractional ratio (e.g., 2.4:1, 1:1.2, 1.3:2.5, etc.). These ratios are not achievable only by selecting the number of fins, which would result in integer ratios (e.g., 1:2, 2:3, etc.). Through the use of "coarse tuning" (e.g., selecting a number of fins) and "fine tuning" (e.g., selecting the position and the width of the dielectric region 110) during the design process, drive strengths of the FinFET devices 106 and 108 may achieve target drive strength ratios associated with target stability values and/or target writability values.

During operation, the first FinFET device 106 and the second FinFET device 108 may operate as parts of one SRAM cell or multiple SRAM cells. For example, the first FinFET device 106 and the second FinFET device 108 may include or correspond to pass-gate transistors of two neighboring SRAM cells, and an input voltage may be applied via a word line to the first gate structure 102 and to the second gate structure 104 to enable access to storage nodes of the two neighboring SRAM cells. As another example, the first FinFET device 106 and the second FinFET device 108 may include or correspond to a pull-up transistor and a pull-down transistor, respectively, of a single SRAM cell, and the first FinFET device 106 and the second FinFET device 108 may operate as part of a pair of cross-coupled inverters to enable a value to be stored at a storage node of the SRAM cell.

Because the first gate structure 102 is separated from the second gate structure 104 by the dielectric region 110 and is coupled to the second gate structure 104 by the metal contact 112, the drive strengths of the FinFET devices 106 and 108 may be set to values that are unachievable by FinFETs that are coupled to a single gate structure (e.g., FinFETs of other SRAM cells). For example, coarse tuning may be performed during the design process by selecting a number of fins of the FinFET devices 106 and 108, and fine tuning may be performed during the design process by selecting the position and the width of the dielectric region 110. Because the drive strengths of the FinFET devices 106 and 108 are based on the number of fins of the FinFET devices 106 and 108 and the position and the width of the dielectric region 110, drive strengths of the FinFET devices 106 and 108 may be set such that target drive strength ratios (e.g., fractional ratios) associated with target stability values and/or target writability values of the one or more SRAM cells may be achieved.

Figure 2:
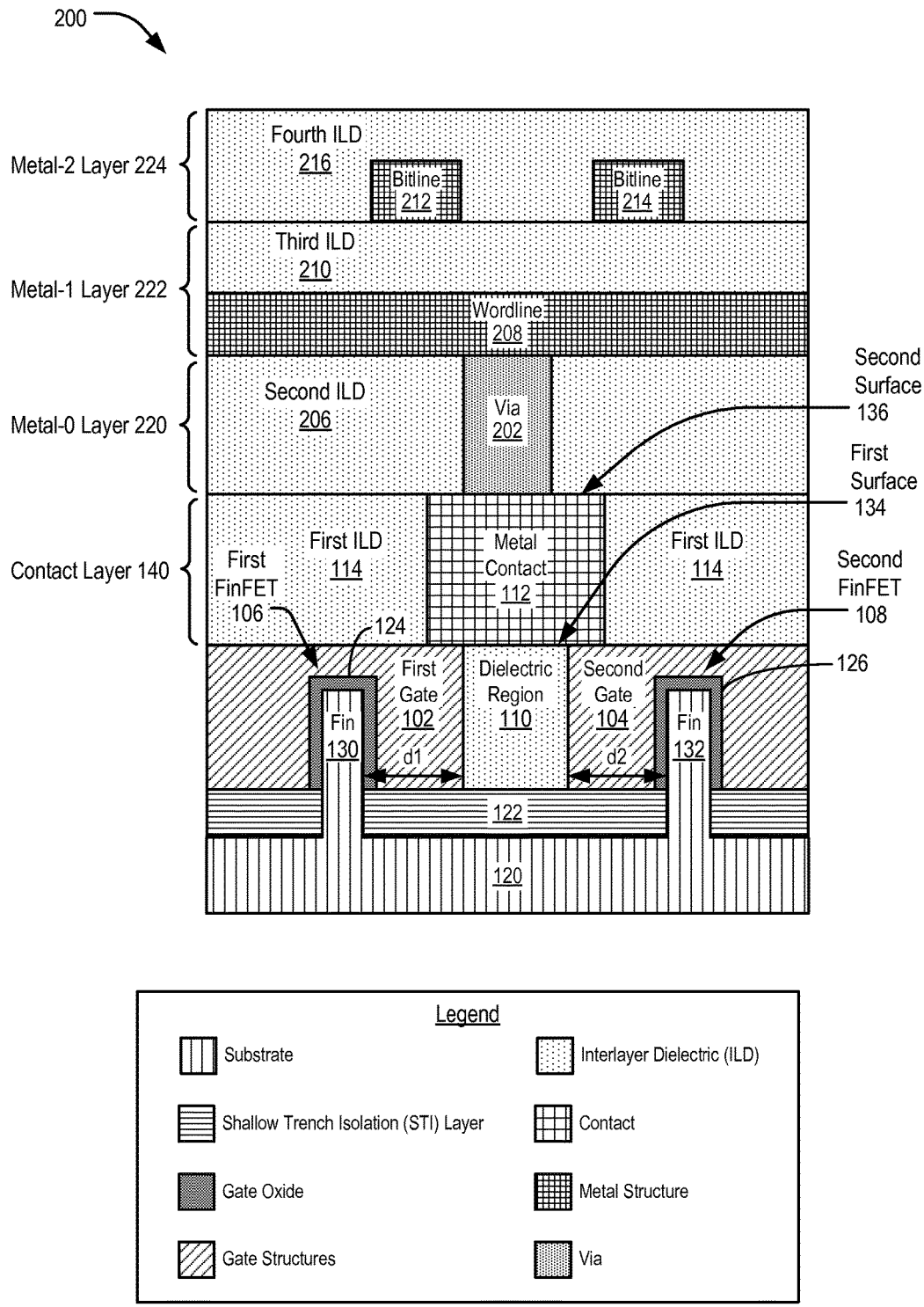
FIG. 2 is a diagram of a first aspect of the integrated circuit of FIG. 1 that illustrates additional metal layers.

Referring to FIG. 2, a first aspect of the integrated circuit 100 of FIG. 1 that includes additional metal layers is depicted and designated 200. The integrated circuit 200 includes the first gate structure 102, the second gate structure 104, the first FinFET device 106, the second FinFET device 108, the dielectric region 110, the metal contact 112, the first ILD 114, the substrate 120, the STI layer 122, the fins 130 and 132, and the gate oxide layers 124 and 126 of FIG. 1. The integrated circuit 200 includes multiple layers. For example, the integrated circuit 200 includes an active area layer (e.g., a layer that includes the FinFET devices 106 and 108 and the gate structures 102 and 104), the contact layer 140 that includes the metal contact 112, and higher metal layers, such as a metal-0 (M0) layer 220, a metal-1 (M1) layer 222, and a metal-2 (M2) layer 224, that may include one or more metal structures and may include via layers (e.g., a via-0 (V0) layer, a via-1 (V1) layer, and a via-2 (V2) layer) that are not illustrated for convenience.

In the implementation illustrated in FIG. 2, the first FinFET device 106 and the second FinFET device 108 include or correspond to NMOS pass-gate transistors. In other implementations, the pass-gate transistors may be PMOS transistors. The first FinFET device 106 may be included in a first memory cell (e.g., a first SRAM cell), and the second FinFET device 108 may be included in a second memory cell (e.g., a second SRAM cell) that is adjacent to the first memory cell. For example, the second FinFET device 108 may be included in a neighboring SRAM cell of the SRAM cell that includes the first FinFET device 106.

The first memory cell and the second memory cell may be coupled to a same word line. For example, the metal contact 112 may be coupled to a word line 208. The word line 208 may include one or more conductive materials. For example, the word line 208 may include copper (Cu), aluminum (Al), and/or tantalum (Ta), as illustrative, non-limiting examples. In a particular implementation illustrated in FIG. 2, the word line 208 is coupled by a via 202 to the metal contact 112. In an alternate implementation, the metal contact 112 is coupled by the via 202 to a metal structure in the M0 layer 220, and the metal structure is coupled to the word line 208 by an additional via. The via 202 may be included in the M0 layer 220 of the integrated circuit 200. The M0 layer 220 may also include a second ILD 206. The second surface 136 (that is opposite to the first surface 134) of the metal contact 112 may abut (e.g., be in contact with) or be adjacent to the via 202. The word line 208 may also be coupled to one or more other circuit elements in the contact layer 140 and to one or more circuit elements in a higher metal layer, such as metal contacts or plugs configured to receive an input of the integrated circuit 200.

The integrated circuit 200 may also include one or more bit lines. For example, the integrated circuit 200 may include bit lines 212 and 214. The bit lines 212 and 214 may include one or more conductive materials. For example, the bit lines 212 and 214 may include copper (Cu), aluminum (Al), and/or tantalum (Ta), as illustrative, non-limiting examples. In a particular implementation, the bit lines 212 and 214 may form a pair of complementary bit lines (e.g., a bit line BL and an inverse bit line BLB). The metal contact 112 may be included in the contact layer 140, the word line 208 may be included in the M1 layer 222, and the bit lines 212 and 214 may be included in the M2 layer 224. The metal contact 112 is included in a layer (e.g., the contact layer 140) that is distinct from higher metal layers (e.g., the M0 layer 220, the M1 layer 222, and the M2 layer 224). The M1 layer 222 may also include a third ILD 210, and the M2 layer 224 may also include a fourth ILD 216.

As described with reference to FIG. 1, the drive strengths of the first FinFET device 106 and the second FinFET device 108 are based on the position and the width of the dielectric region 110. Because the FinFET devices 106 and 108 are NMOS transistors in the implementation illustrated in FIG. 2, a smaller distance between the FinFET devices 106 and 108 and the dielectric region 110 corresponds to higher drive strengths of the FinFET devices 106 and 108. In a particular implementation, a center of the dielectric region 110 is positioned midway between the first FinFET device 106 and the second FinFET device 108. In this implementation, the distance d1 (between the first FinFET device 106 and the dielectric region 110) and the distance d2 (between the second FinFET device 108 and the dielectric region 110) is substantially equal (e.g., the dielectric region 110 is substantially the same distance from the first FinFET device 106 and the second FinFET device 108). Accordingly, the drive strength of the first FinFET device 106 and the drive strength of the second FinFET device 108 are substantially equal. Additionally, a width of the dielectric region 110 may be selected during a design process of the integrated circuit 200 to achieve target drive strengths of the first FinFET device 106 and the second FinFET device 108. For example, target drive strengths of the FinFET devices 106 and 108 may be associated with particular values of d1 and d2, and the width of the dielectric region 110 may be selected during the design process so that d1 and d2 have the particular values. In this manner, drive strengths of pass-gate FinFETs (e.g., the first FinFET device 106 and the second FinFET device 108) may be set to achieve drive strength ratios associated with target writability values and/or target stability values.

Figure 3:
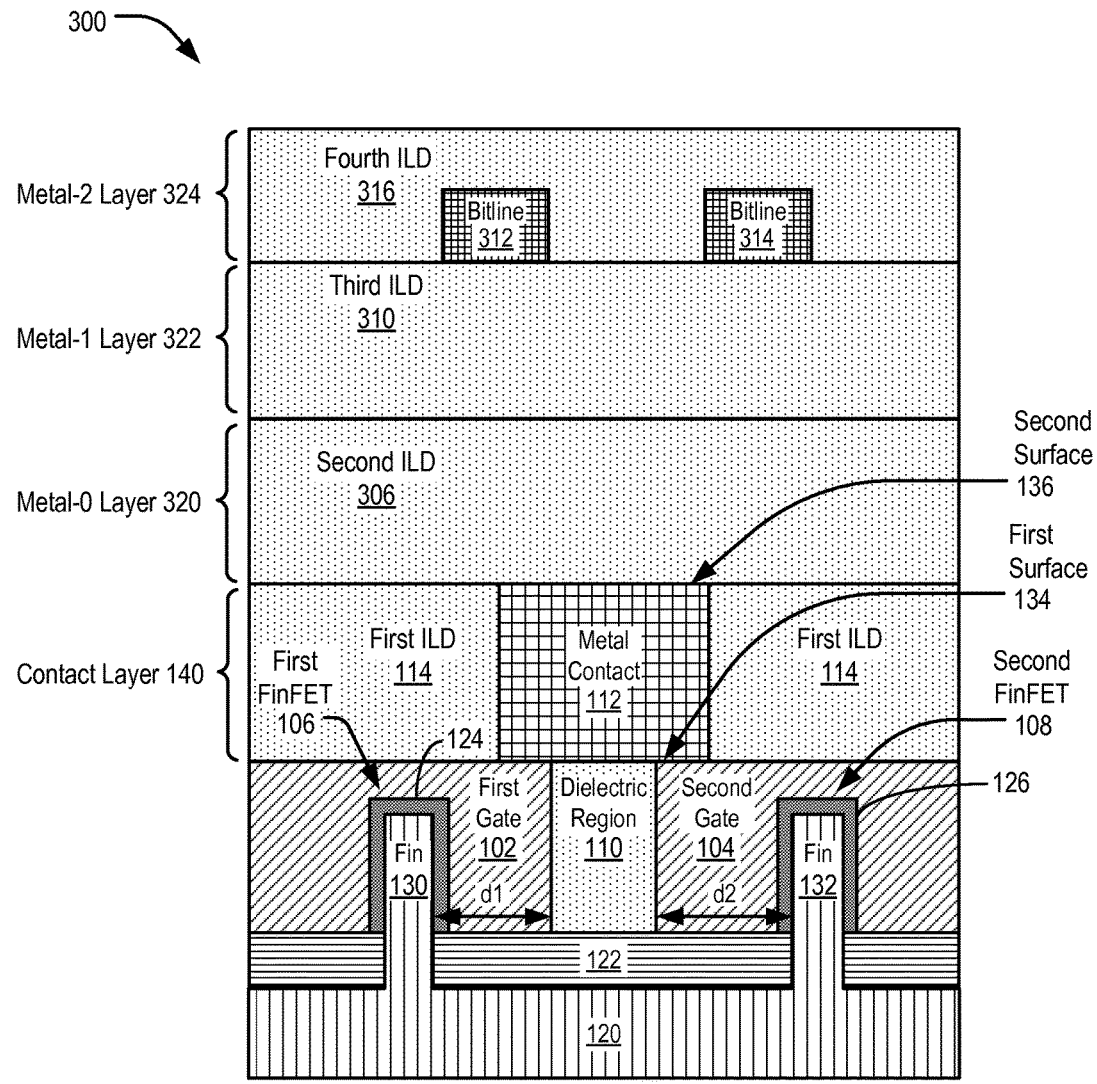
FIG. 3 is a diagram of a second aspect of the integrated circuit of FIG. 1 that illustrates additional metal layers.

Referring to FIG. 3, a second aspect of the integrated circuit 100 of FIG. 1 that includes additional metal layers is depicted and designated 300. The integrated circuit 300 includes the first gate structure 102, the second gate structure 104, the first FinFET device 106, the second FinFET device 108, the dielectric region 110, the metal contact 112, the first ILD 114, the substrate 120, the STI layer 122, the fins 130 and 132, and the gate oxide layers 124 and 126 of FIG. 1. The integrated circuit 300 includes multiple layers. For example, the integrated circuit 300 includes an active area layer (e.g., a layer that includes the FinFET devices 106 and 108 and the gate structures 102 and 104), the contact layer 140 that includes the metal contact 112, and higher metal layers, such as a metal-0 (M0) layer 320, a metal-1 (M1) layer 322, and a metal-2 (M2) layer 324, that may include one or more metal structures and may include via layers (e.g., a via-0 (V0) layer, a via-1 (V1) layer, and a via-2 (V2) layer) that are not illustrated for convenience.

In the implementation illustrated in FIG. 3, the first FinFET device 106 includes or corresponds to a pull-up transistor, and the second FinFET device 108 includes or corresponds to a pull-down transistor. The first FinFET device 106 may include an NMOS transistor, and the second FinFET device 108 may include a PMOS transistor. In this implementation, the first FinFET device 106 and the second FinFET device 108 may be included in the same memory cell (e.g., the same SRAM cell). For example, the FinFET devices 106 and 108 may be two transistors of a 6T SRAM cell. In other implementations, the FinFET devices 106 and 108 may include or correspond to other transistors and/or may be included in other memory cells.

In the implementation illustrated in FIG. 3, the metal contact 112 couples the first gate structure 102 to the second gate structure 104. The metal contact 112 is not coupled to a metal structure in a higher metal layer. For example, the metal contact 112 is not coupled to a word line, as illustrated in FIG. 2. The second surface 136 (that is opposite to the first surface 134) of the metal contact 112 may be adjacent to a second ILD 306. For example, the second surface 136 may be in contact with (e.g., abut) the second ILD 306. The second ILD 306 may be included in the M0 layer 320 of the integrated circuit 300. The M0 layer 320 may also include a second ILD 306.

The integrated circuit 300 may also include one or more bit lines. For example, the integrated circuit 300 may include bit lines 312 and 314. The bit lines 312 and 314 may include one or more conductive materials. For example, the bit lines 312 and 314 may include copper (Cu), aluminum (Al), and/or tantalum (Ta), as illustrative, non-limiting examples. In a particular implementation, the bit lines 312 and 314 may form a pair of complementary bit lines (e.g., a bit line BL and an inverse bit line BLB). The metal contact 112 may be included in the contact layer 140, a word line (not illustrated) may be included in the M1 layer 322, and the bit lines 312 and 314 may be included in the M2 layer 324. The metal contact 112 is included in a layer (e.g., the contact layer 140) that is distinct from higher metal layers (e.g., the M0 layer 320, the M1 layer 322, and the M2 layer 324). The M1 layer 322 may also include a third ILD 310, and the M2 layer 324 may also include a fourth ILD 316.

As described with reference to FIG. 1, the drive strengths of the first FinFET device 106 and the second FinFET device 108 are based on the position and the width of the dielectric region 110. Because the first FinFET device 106 includes an NMOS transistor and the second FinFET device 108 includes a PMOS transistor in the implementation illustrated in FIG. 3, the position and the width of the dielectric region 110 has an opposite effect on the drive strength of the first FinFET device 106 and the drive strength of the second FinFET device 108. In a particular implementation, the dielectric region 110 is positioned closer to the first FinFET device 106 than to the second FinFET device 108. In this implementation, the distance d1 (between the first FinFET device 106 and the dielectric region 110) is less than the distance d2 (between the second FinFET device 108 and the dielectric region 110). Because the first FinFET device 106 includes an NMOS transistor and the second FinFET device 108 includes a PMOS transistor, the drive strength of the first FinFET device 106 and the drive strength of the second FinFET device 108 are increased as compared to if the dielectric region 110 is positioned midway between the FinFET devices 106 and 108. In another implementation, the dielectric region 110 is positioned closer to the second FinFET device 108 than to the first FinFET device 106. In this implementation, the distance d1 (between the first FinFET device 106 and the dielectric region 110) is greater than the distance d2 (between the second FinFET device 108 and the dielectric region 110). Because the first FinFET device 106 includes an NMOS transistor and the second FinFET device 108 includes a PMOS transistor, the drive strength of the first FinFET device 106 and the drive strength of the second FinFET device 108 may be reduced as compared to the previous implementation. Thus, the position and the width of the dielectric region 110 may be selected so that d1 and d2 have particular values. In this manner, drive strengths of the pull-up FinFET (e.g., the first FinFET device 106) and the pull-down FinFET (e.g., the second FinFET device 108) may be set to achieve drive strength ratios associated with target writability values and/or target stability values.

Figure 4:
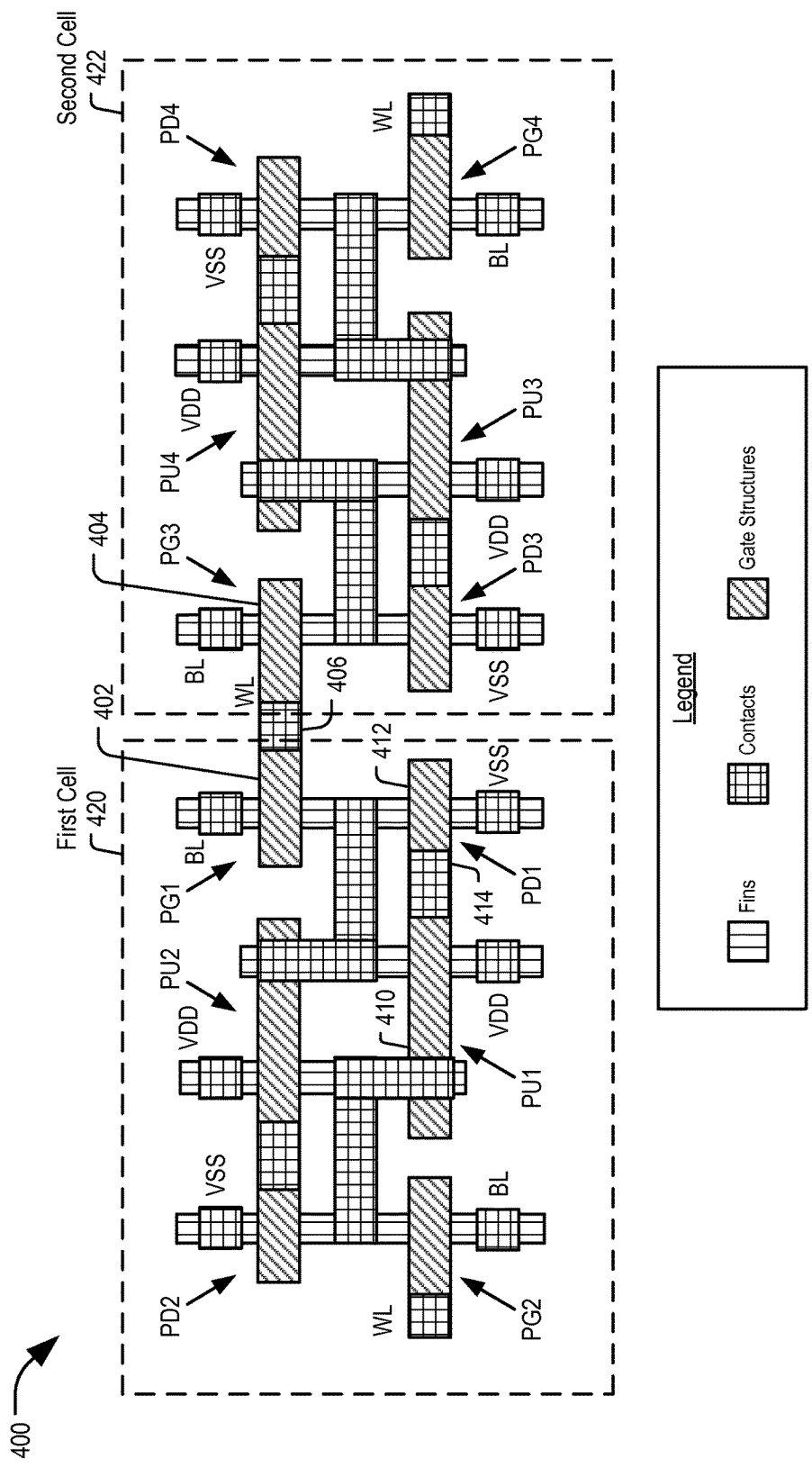
FIG. 4 is a diagram of a top-down view of an integrated circuit that includes multiple memory cells including gate structures that are separated by dielectric regions and that are electrically coupled by metal contacts.

Referring to FIG. 4, a top down view of an integrated circuit that includes multiple memory cells including gate structures that are separated by dielectric regions and that are electrically coupled by metal contacts is depicted and designated 400. In a particular implementation, the integrated circuit 400 may include or correspond to the integrated circuit 100 of FIG. 1, the integrated circuit 200 of FIG. 2, the integrated circuit 300 of FIG. 3, or a combination thereof.

The integrated circuit 400 includes multiple SRAM cells. In a particular implementation, the multiple SRAM cells may be included in a memory array of an SRAM device. In a particular implementation, the multiple SRAM cells may include 6T-SRAM cells. In other implementations, the SRAM cells may include other types of SRAM cells. A first memory cell 420 includes two pass-gate transistors PG1 and PG2, two pull-up transistors PU1 and PU2, and two pull-down transistors PD1 and PD2. A second memory cell 422 includes two pass-gate transistors PG3 and PG4, two pull-up transistors PU3 and PU4, and two pull-down transistors PD3 and PD4. Each of the transistors of the memory cells 420 and 422 are FinFET devices. The memory cells 420 and 422 also include gate structures and metal contacts. The gate structures may be coupled to one or more fins of the transistors, and the metal contacts may be coupled to one or more transistors, one or more gate structures, or one or more metal lines in higher metal layers. For example, some of the contacts may couple gate structures or transistors to a power line (VDD), a ground line (VSS), a word line (WL), or a bit line (BL).

Gate structures of different memory cells may be separated by dielectric regions and may be coupled together by metal contacts. For example, a first gate structure 402 coupled to the pass-gate transistor PG1 and a second gate structure 404 coupled to the pass-gate transistor PG3 may be separated by a dielectric region. A first metal contact 406 may be coupled to the first gate structure 402 and to the second gate structure 404. The first metal contact 406 may have a surface that is in contact with the dielectric region, the first gate structure 402, and the second gate structure 404. The first metal contact 406 may also be coupled to a word line (WL) in a higher metal layer. In a particular implementation, the configuration of the pass-gate transistors PG1 and PG3, the gate structures 402 and 404, and the first metal contact 406 may correspond to the gate structures 102 and 104, the FinFET devices 106 and 108, and the metal contact 112 of FIG. 2. Similarly, a gate structure coupled to the pass-gate transistor PG2 (or the pass-gate transistor PG4) may be separated from a gate structure coupled to a pass-gate transistor of a neighboring SRAM cell by a dielectric region, and a metal contact may couple the gate structures to a word line. In a particular implementation, a position of the dielectric region (between the first gate structure 402 and the second gate structure 404) is substantially equidistant from the pass-gate transistor PG1 and from the pass-gate transistor PG3. As described with reference to FIG. 2, a width of the dielectric region may be selected during a design process so that the transistors PG1 and PG3 have drive strengths that achieve target stability values or target writability values for the memory cells 420 and 422.

Gate structures of the same memory cell may also be separated by dielectric regions and may be coupled together by metal contacts. For example, a third gate structure 410 coupled to the pull-up transistor PU1 and a fourth gate structure 412 coupled to the pull-down transistor PD1 may be separated by a dielectric region. A second metal contact 414 may be coupled to the third gate structure 410 and to the fourth gate structure 412. The second metal contact may have a surface that is in contact with the third gate structure 410 and the fourth gate structure 412. The second metal contact 414 is not coupled a word line (WL) in a higher metal layer. In a particular implementation, the configuration of the transistors PU1 and PD1, the gate structures 410 and 412, and the second metal contact 414 may correspond to the gate structures 102 and 104, the FinFET devices 106 and 108, and the metal contact 112 of FIG. 3. Similarly, a gate structure coupled to the pull-up transistor PU2 (or one of the pull-up transistors PU3 and PU4) may be separated from a gate structure coupled to the pull-down transistor PD2 (or one of the pull-down transistors PD3 and PD4) by a dielectric region, and a metal contact may be electrically coupled to the gate structures and not to a word line.

In a particular implementation, the second metal contact 414 is positioned such that a distance from the pull-up transistor PU1 to the second metal contact 414 is less than a distance from the pull-down transistor PD1 and the second metal contact 414. For example, during a design process, the second metal contact 414 may be positioned closer to the pull-up transistor PU1 than the pull-down transistor PD1 to increase the drive strengths of the transistors PU1 and PD1. In another particular implementation, the second metal contact 414 is positioned such that the distance from the pull-up transistor PU1 to the second metal contact 414 is greater than the distance from the pull-down transistor PD1 and the second metal contact 414. For example, during the design process, the second metal contact 414 may be positioned closer to the pull-down transistor PD1 than the pull-up transistor PU1 As explained with reference to FIG. 3, the width and the position of the second metal contact 414 may be selected during the design process so that the transistors PG1 and PG3 have drive strengths that achieve target stability values or target writability values for the first memory cell 420.

Because drive strengths of at least some of the transistors (e.g., the FinFET devices) of the integrated circuit 400 are based on positions and widths of dielectric regions, the positions and widths of the dielectric regions may be selected during a design process of the integrated circuit 400 to enable the memory cells 420 and 422 to achieve particular drive strength ratios (e.g., fractional ratios) associated with target stability values and/or target writability values.

FIGS. 5A-D illustrate examples of stages of a first fabrication process that may be used to fabricate an integrated circuit. The stages of the first fabrication process are shown as cross-sectional views of formation of the integrated circuit. The integrated circuit may include gate structures that are separated by a dielectric region and that are electrically coupled by a metal contact. In a particular implementation, the first fabrication process may be used to fabricate the integrated circuit 100 of FIG. 1.

Referring to FIG. 5A, a first stage of the first fabrication process is depicted and generally designated 500. FIG. 5A illustrates a first FinFET device 506, a second FinFET device 508, and a single gate structure 520. The first FinFET device 506 and the second FinFET device 508 may include fins, source regions, drain regions, and optional gate oxide layers. In a particular implementation, the first FinFET device 506 and the second FinFET device 508 may include or correspond to the first FinFET device 106 and the second FinFET device 108 of FIG. 1. The single gate structure 520 may be formed on (e.g., surrounding) the first FinFET device 506 and the second FinFET device 508. The single gate structure 520 may be formed by depositing a conductive gate material in a region surrounding the FinFET devices 506 and 508. The conductive gate material may include polysilicon, tantalum nitride (TaN), and/or titanium nitride (TiN), as illustrative, non-limiting examples.

Referring to FIG. 5B, a second stage of the first fabrication process is depicted and generally designated 550. In FIG. 5B, a cut has been performed on the single gate structure 520 to separate the single gate structure 520 into the first gate structure 502 and the second gate structure 504. The cut may be performed using a mask and an etching process, such as a photolithography process or a chemical etch process. Performing the cut forms a trench 522 between the first gate structure 502 and the second gate structure 504. For example, performing the cut may remove a portion of the single gate structure 520 in the area of the trench 522. After performing the cut, the first gate structure 502 and the second gate structure 504 are separated by the trench 522. A width of the trench 522 and a position of the trench 522 may correspond to a width and a position of a feature of the mask used to perform the cut and to form the trench 522. The width and the position of the trench 522 (or a width and a position of the feature of the mask) may be selected during a design process of the integrated circuit to set a distance d1 (between the first FinFET device 506 and the trench 522) and a second distance d2 (between the second FinFET device 508 and the trench 522) at particular values. The particular values of the distances d1 and d2 may be associated with target drive strengths of the FinFET devices 506 and 508, as described with reference to FIGS. 1-3.

Referring to FIG. 5C, a third stage of the first fabrication process is depicted and generally designated 560. In FIG. 5C, after performing the cut, a first interlayer dielectric (ILD) 514 is deposited. The first ILD 514 may include a dielectric material, such as a high-k dielectric. The first ILD 514 may be deposited in a region between the first gate structure 502 and the second gate structure 504. The first ILD 514 may also be deposited on the first gate structure 502 and the second gate structure 504. The first ILD 514 may form a dielectric region 510 between the first gate structure 502 and the second gate structure 504. The dielectric region 510 may be a portion of the first ILD 514 and may be formed prior to formation of a metal contact. The dielectric region 510 may have a position and a width that is the same as the trench 522 in FIG. 5B. As described with reference to FIGS. 1-3, the distances d1 and d2 may be based on target drive strengths of the FinFET devices 506 and 508. After depositing the first ILD 514, a chemical-mechanical planarization (CMP) process may be performed to smooth a surface of the first ILD 514.

Referring to FIG. 5D, a fourth stage of the first fabrication process is depicted and generally designated 570. In FIG. 5D, a metal contact 512 is formed on the dielectric region 510. The metal contact 512 may be formed by patterning a region in the first ILD 514 and depositing a metal in the region. The metal may be deposited using an electroplating process or other metal deposition process. The metal contact 512 may include a metal, such as copper (Cu), aluminum (Al), tungsten (W), and/or tantalum (Ta), as illustrative, non-limiting examples. The metal contact 512 may be wider than the dielectric region 510 and a surface (e.g., a bottom surface) of the metal contact 512 may abut a portion of the first FinFET device 506 and a portion of the second FinFET device 508.

FIGS. 6A-D illustrate examples of stages of a second fabrication process that may be used to fabricate an integrated circuit. The stages of the second fabrication process are shown as cross-sectional views of formation of the integrated circuit. The integrated circuit may include gate structures that are separated by a dielectric region and that are electrically coupled by a metal contact. In a particular implementation, the second fabrication process may be used to fabricate the integrated circuit 100 of FIG. 1.

Referring to FIG. 6A, a first stage of the second fabrication process is depicted and generally designated 600. FIG. 6A illustrates a first FinFET device 606, a second FinFET device 608, and a first ILD 614 disposed on and surrounding the first FinFET device 606 and the second FinFET device 608. The first FinFET device 606 and the second FinFET device 608 may include fins, source regions, drain regions, and optional gate oxide layers. In a particular implementation, the first FinFET device 606 and the second FinFET device 608 may include or correspond to the first FinFET device 106 and the second FinFET device 108 of FIG. 1. The first ILD 614 may include a dielectric material, such as a high-k dielectric.

Referring to FIG. 6B, a second stage of the second fabrication process is depicted and generally designated 650. In FIG. 6B, regions are patterned in the first ILD 614 using a patterning process. The patterning may be performed using a mask and an etching process, such as a photolithography process or a chemical etch process. A first region 622 may be patterned surrounding the first FinFET device 606 and a second region 624 may be patterned surrounding the second FinFET device 608. After patterning the first region 622 and the second region 624, a region of the first ILD 614 remains between the first FinFET device 606 and the second FinFET device 608. A position and a width of the region of the first ILD 614 may be selected during a design process of the integrated circuit by selecting widths of the regions 622 and 624. For example, widths of features of a mask used to pattern the regions 622 and 624 may be selected during the design process in order to select the position and the width of the region of the first ILD 614. The position and the width of the region of the first ILD 614 may be selected to set a distance d1 (between the first FinFET device 606 and the region of the first ILD 614) and a second distance d2 (between the second FinFET device 608 and the region of the first ILD 614) at particular values. The particular values of the distances d1 and d2 may be associated with target drive strengths of the FinFET devices 606 and 608, as described with reference to FIGS. 1-3.

Referring to FIG. 6C, a third stage of the second fabrication process is depicted and generally designated 660. In FIG. 6C, after patterning the regions 622 and 624, a conductive gate material is deposited in the first region 622 to form a first gate structure 602 and the conductive gate material is deposited in the second region 624 to form the second gate structure 604. The conductive gate material may include polysilicon, tantalum nitride (TaN), and/or titanium nitride (TiN), as illustrative, non-limiting examples. The conductive gate material may be deposited on and surrounding the first FinFET device 606 to form the first gate structure 602, and the conductive gate material may be deposited on and surrounding the second FinFET device 608 to form the second gate structure 604. After formation, the first gate structure 602 and the second gate structure 604 may be separated by a dielectric region 610 (e.g., a portion of the first ILD 614). The dielectric region 610 may correspond to a portion of the region of the first ILD 614 illustrated in FIG. 6B. After depositing the conductive gate material to form the gate structures 602 and 604, additional dielectric material may be deposited on the first gate structure 602 and the second gate structure 604. The additional dielectric material may become part of the first ILD 614. After depositing the additional dielectric material, a CMP process may be performed to smooth a surface of the first ILD 614.

Referring to FIG. 6D, a fourth stage of the second fabrication process is depicted and generally designated 670. In FIG. 6D, a metal contact 612 is formed on the dielectric region 610. The metal contact 612 may be formed by patterning a region in the first ILD 614 and depositing a metal in the region. The metal may be deposited using an electroplating process or other metal deposition process. The metal contact 612 may include a metal, such as copper (Cu), aluminum (Al), tungsten (W), and/or tantalum (Ta), as illustrative, non-limiting examples. The metal contact 612 may be wider than the dielectric region 610 and a surface (e.g., a bottom surface) of the metal contact 612 may abut a portion of the first FinFET device 606 and a portion of the second FinFET device 608.

Referring to FIG. 7, a flow chart of an illustrative aspect of a method 700 of fabricating an integrated circuit is depicted. The integrated circuit includes gate structures that are separated by a dielectric region and that are electrically coupled by a metal contact. The integrated circuit may include or correspond to the integrated circuit 100 of FIG. 1, the integrated circuit 200 of FIG. 2, or the integrated circuit 300 of FIG. 3.

The method 700 of fabricating the integrated circuit includes forming a first gate structure over a first fin field-effect transistor (FinFET) device, at 702. For example, with reference to FIG. 1, the first gate structure 102 may be formed over (e.g., surrounding) the first FinFET device 106.

The method 700 includes forming a second gate structure over a second FinFET device, at 704. For example, with reference to FIG. 1, the second gate structure 104 may be formed over (e.g., surrounding) the second FinFET device 108. The first gate structure 102 and the second gate structure 104 may be separated by the dielectric region 110.

The method 700 includes depositing a dielectric material in a region between the first FinFET device and the second FinFET device to form a dielectric region, at 706. The first gate structure and the second gate structure may be separated by the dielectric region. For example, with reference to FIG. 1, a dielectric material is deposited to form the dielectric region 110 that separates the first gate structure 102 and the second gate structure 104. Deposition of the dielectric material is described with reference to FIGS. 5 and 6.

The method 700 further includes forming a metal contact having a surface that is in contact with the dielectric region, the first gate structure, and the second gate structure, at 708. For example, with reference to FIG. 1, the metal contact 112 has the first surface 134 (e.g., the bottom surface) that is in contact with (e.g., abuts) the dielectric region 110, the first gate structure 102, and the second gate structure 104.

In a particular implementation, the method 700 includes forming a single gate structure over (e.g., surrounding) the first FinFET device and the second FinFET device prior to forming the first gate structure and the second gate structure. In this implementation, the method 700 further includes performing a cut on the single gate structure to separate the single gate structure into the first gate structure and the second gate structure. For example, the single gate structure 520 may be formed over (e.g., surrounding) the FinFET devices 506 and 508, as described with reference to FIG. 5A, and a cut may be performed on the single gate structure 520 to separate the single gate structure 520 into the first gate structure 502 and the second gate structure 504, as described with reference to FIG. 5B. In a particular implementation, the dielectric material may be deposited after performing the cut, and the region between the first FinFET device and the second FinFET device may include a region between the first gate structure and the second gate structure. For example, the dielectric material of the first ILD 514 may be deposited in a region between the first gate structure 502 and the second gate structure 504 to form the dielectric region 510, as described with reference to FIG. 5C.

In a particular implementation, the dielectric material may be deposited prior to forming the first gate structure and the second gate structure, and the dielectric material may be deposited on the first FinFET device, on the second FinFET device, and in the region between the first FinFET device and the second FinFET device. For example, the dielectric material may be deposited prior to formation of the first gate structure 602 and the second gate structure 604, as illustrated in FIG. 6A. In this implementation, the method 700 may further include patterning a first region and a second region in the dielectric material. The first region may surround the first FinFET device, and the second region may surround the second FinFET device. For example, prior to formation of gate structures, the dielectric material of the first ILD 614 may be deposited on and surround the first FinFET device 606 and the second FinFET device 608, as described with reference to FIG. 6A. After depositing the dielectric material, the first region 622 and the second region 624 may be patterned, as described with reference to FIG. 6B.

Additionally, the method 700 may include depositing a conductive gate material in the first region to form the first gate structure and depositing the conductive gate material in the second region to form the second gate structure. For example, the conductive gate material may be deposited in the first region 622 to form the first gate structure 602 and the conductive gate material may be deposited in the second region 624 to form the second gate structure 604, as described with reference to FIG. 6C. The method 700 may further include depositing the dielectric material on the first gate structure and the second gate structure. For example, the dielectric material of the first ILD 614 may be deposited on the first gate structure 602 and the second gate structure 604, as described with reference to FIG. 6C.

In a particular implementation, the method 700 includes patterning a region in the dielectric material that is deposited on the first gate structure and the second gate structure and depositing metal in the region to form the metal contact. For example, a region may be patterned over (e.g., above, in the orientation illustrated in FIG. 5D) the dielectric region 510 (or the dielectric region 610), and metal may be deposited in the region to form the metal contact 512 (or the metal contact 612), as described with reference to FIGS. 5D and 6D. A width of the metal contact 512 may be larger than a width of the dielectric region 510 so that the metal contact 512 has a surface (e.g., a bottom surface) that is in contact with (e.g., abuts) the dielectric region 510, a portion of the first gate structure 502 and a portion of the second gate structure 504.

In another particular implementation, the method 700 includes forming a word line and forming a via connecting the metal contact to the word line. The metal contact may be included in a contact layer, and the word line may be included in a metal-1 layer. For example, with reference to FIG. 2, the via 202 may be formed to connect the metal contact 112 to the word line 208. As illustrated in FIG. 2, the metal contact 112 is included in the contact layer 140, and the word line 208 is included in the metal-1 (M1) layer 222, which is a higher metal layer as compared to the contact layer 140.

The method 700 may be used to form a memory cell or multiple memory cells (e.g., SRAM cells) that includes FinFET devices having drive strengths that achieve target drive strength ratios, such as fractional ratios, that are associated with a target stability value or a target writability value. The drive strengths of the FinFET devices may be tuned, during a design process, by selecting a number of fins of the FinFET devices and a position and width of dielectric regions that separate gate structures coupled to the FinFET devices. In this manner, target drive strength ratios may be achieved that are not achievable only by selecting the number of fins of the FinFET devices.

The method 700 of FIG. 7 may be implemented by a field-programmable gate array (FPGA) device, an application-specific integrated circuit (ASIC), a processing unit such as a central processing unit (CPU), a digital signal processor (DSP), a controller, another hardware device, a firmware device, or any combination thereof. As an example, the method 700 of FIG. 7 may be performed by one or more processors that execute instructions stored at a memory, such as a non-transitory computer-readable medium. The one or more processors and the memory may be integrated within equipment of a semiconductor fabrication plant to perform a fabrication process, as described further with reference to FIG. 9.

Referring to FIG. 8, a block diagram of a particular illustrative implementation of a wireless communication device 800 is depicted. The device 800 may include an integrated circuit 864. The integrated circuit 864 may include or correspond to the integrated circuit 100 of FIG. 1. Additionally, the integrated circuit 864 may be formed using the method 700 of FIG. 7.

The device 800 includes a processor 810, such as a digital signal processor (DSP), coupled to a memory 832. The processor 810 may include the integrated circuit 864 (e.g., the integrated circuit 100 of FIG. 1). For example, the processor 810 may include a component that includes a static random access memory (SRAM) array, and the component may include the integrated circuit 864 (e.g., the integrated circuit 100 of FIG. 1).

The memory 832 includes instructions 868 (e.g., executable instructions) such as computer-readable instructions or processor-readable instructions. The instructions 868 may include one or more instructions that are executable by a computer, such as the processor 810.

FIG. 8 also illustrates a display controller 826 that is coupled to the processor 810 and to a display 828. A coder/decoder (CODEC) 834 may also be coupled to the processor 810. A speaker 836 and a microphone 838 may be coupled to the CODEC 834.

FIG. 8 also illustrates that a wireless interface 840, such as a wireless controller, and a transceiver 846 may be coupled to the processor 810 and to an antenna 842, such that wireless data received via the antenna 842, the transceiver 846, and the wireless interface 840 may be provided to the processor 810. In some implementations, the processor 810, the display controller 826, the memory 832, the CODEC 834, the wireless interface 840, and the transceiver 846 are included in a system-in-package or system-on-chip device 822. In some implementations, an input device 830 and a power supply 844 are coupled to the system-on-chip device 822. Moreover, in a particular aspect, as illustrated in FIG. 8, the display 828, the input device 830, the speaker 836, the microphone 838, the antenna 842, and the power supply 844 are external to the system-on-chip device 822. However, each of the display 828, the input device 830, the speaker 836, the microphone 838, the antenna 842, and the power supply 844 may be coupled to a component of the system-on-chip device 822, such as an interface or a controller. Although the integrated circuit 864 (e.g., the integrated circuit 100 of FIG. 1) is depicted as being included in the processor 810, the integrated circuit 864 may be included in another component of the device 800 or a component coupled to the device 800. For example, the integrated circuit 864 (e.g., the integrated circuit 100 of FIG. 1) may be included in the wireless interface 840, the transceiver 846, the power supply 844, the input device 830, the display controller 826, or another component that includes an SRAM.

In conjunction with the described aspects, a first apparatus includes means for storing a data value. The means for storing may include or correspond to a memory cell that includes the integrated circuit 100 of FIG. 1, a memory cell that includes the integrated circuit 200 of FIG. 2, a memory cell that includes the integrated circuit 300 of FIG. 3, the first memory cell 420, the second memory cell 422 of FIG. 4, one or more other structures or circuits configured to store a data value, or any combination thereof. The means for storing may include first a FinFET device. For example, the means for storing may include or correspond to a memory cell (such as the memory cells 420 and 422 of FIG. 4) that include one or more FinFET devices. The first FinFET device may be coupled to a first gate structure, and the first gate structure and a second gate structure that is coupled to a second FinFET device may be separated by a dielectric region.

The first apparatus further includes means for electrically coupling the first gate structure to the second gate structure. The means for electrically coupling may include or correspond to the metal contact 112 of FIGS. 1-3, the first metal contact 406, the second metal contact 414 of FIG. 4, the metal contact 512 of FIG. 5, the metal contact 612 of FIG. 6, one or more other structures or circuits configured to electrically couple a first gate structure to a second gate structure, or any combination thereof. The means for electrically coupling may have a surface that is in contact with the dielectric region, the first gate structure, and the second gate structure.

In a particular implementation, a target drive strength of the first FinFET device, a target drive strength of the second FinFET device, or a combination thereof, may be based on a width of the dielectric region and a position of the dielectric region, as described with reference to FIGS. 1-3. In another particular implementation, the first FinFET device and the second FinFET device may include pass-gate transistors. In this implementation, a word line may be coupled to the means for electrically coupling, the means for electrically coupling may be included in a contact layer, and the word line may be included in a higher metal layer. For example, the FinFET devices may include pass-gate transistors, as described with reference to FIG. 2, the means for electrically coupling may be coupled to the word line 208 and may be included in the contact layer 140, and the word line 208 may be included in the metal-1 layer 222. In an alternate implementation, the first FinFET device may include a pull-up transistor, the second FinFET device may include a pull-down transistor, and the means for electrically coupling may have a second surface that is opposite to the first surface and that is adjacent to a second dielectric region. For example, the first FinFET device and the second FinFET device may include a pull-up transistor and a pull-down transistor, respectively, as described with reference to FIG. 3, and the means for electrically coupling may have a second surface that is adjacent to the second ILD 306. In this implementation, the means for electrically coupling is not coupled to a metal structure in a higher metal layer (such as the metal-0 layer 320, the metal-1 layer 322, and/or the metal-2 layer 324).

One or more of the disclosed aspects may be implemented in a system or an apparatus, such as the device 800, that may include a communications device, a personal digital assistant (PDA), a mobile phone, a cellular phone, a navigation device, a computer, a portable computer, a desktop computer, a set top box, an entertainment unit, a fixed location data unit, a mobile location data unit, a monitor, a computer monitor, a television, a tuner, a radio, a satellite radio, a music player, a digital music player, a portable music player, a video player, a digital video player, a digital video disc (DVD) player, a portable digital video player, or any other device that stores or retrieves data or computer instructions, or any combination thereof.

The foregoing disclosed devices and functionalities may be designed and configured into computer files (e.g. RTL, GDSII, GERBER, etc.) stored on computer readable media. Some or all such files may be provided to fabrication handlers to fabricate devices based on such files. Resulting products include semiconductor wafers that are then cut into semiconductor dies and packaged into semiconductor chips. The semiconductor chips are then employed in devices described above. FIG. 9 depicts a particular illustrative implementation of an electronic device manufacturing process 900.

Physical device information 902 is received at the manufacturing process 900, such as at a research computer 906. The physical device information 902 may include design information representing at least one physical property of a semiconductor device, such as the integrated circuit 100 of FIG. 1. For example, the physical device information 902 may include physical parameters, material characteristics, and structure information that is entered via a user interface 904 coupled to the research computer 906. The research computer 906 includes a processor 908, such as one or more processing cores, coupled to a computer readable medium (e.g., a non-transitory computer readable medium) such as a memory 910. The memory 910 may store computer readable instructions that are executable to cause the processor 908 to transform the physical device information 902 to comply with a file format and to generate a library file 912.

In a particular implementation, the library file 912 includes at least one data file including the transformed design information. For example, the library file 912 may include a library of semiconductor devices, such as the integrated circuit 100 of FIG. 1 that is provided for use with an electronic design automation (EDA) tool 920.

The library file 912 may be used in conjunction with the EDA tool 920 at a design computer 914 including a processor 916, such as one or more processing cores, coupled to a memory 918. The EDA tool 920 may be stored as processor executable instructions at the memory 918 to enable a user of the design computer 914 to design a circuit including the integrated circuit 100 of FIG. 1 of the library file 912. For example, a user of the design computer 914 may enter circuit design information 922 via a user interface 924 coupled to the design computer 914. The circuit design information 922 may include design information representing at least one physical property of a semiconductor device, such as the integrated circuit 100 of FIG. 1. To illustrate, the circuit design property may include identification of particular circuits and relationships to other elements in a circuit design, positioning information, feature size information, interconnection information, or other information representing a physical property of a semiconductor device.

The design computer 914 may be configured to transform the design information, including the circuit design information 922, to comply with a file format. To illustrate, the file formation may include a database binary file format representing planar geometric shapes, text labels, and other information about a circuit layout in a hierarchical format, such as a Graphic Data System (GDSII) file format. The design computer 914 may be configured to generate a data file including the transformed design information, such as a GDSII file 926 that includes information describing the integrated circuit 100 of FIG. 1, in addition to other circuits or information. To illustrate, the data file may include information corresponding to a system-on-chip (SOC) that includes the integrated circuit 100 of FIG. 1 and that also includes additional electronic circuits and components within the SOC.

The GDSII file 926 may be received at a fabrication process 928 to manufacture the integrated circuit 100 of FIG. 1, according to transformed information in the GDSII file 926. For example, a device manufacture process may include providing the GDSII file 926 to a mask manufacturer 930 to create one or more masks, such as masks to be used with photolithography processing, illustrated as a representative mask 932. The mask 932 may be used during the fabrication process 928 to generate one or more wafers 933, which may be tested and separated into dies, such as a representative die 936. The die 936 includes a circuit including the integrated circuit 100 of FIG. 1.

For example, the fabrication process 928 may include a processor 934 and a memory 935 to initiate and/or control the fabrication process 928. The memory 935 may include executable instructions such as computer-readable instructions or processor-readable instructions. The executable instructions may include one or more instructions that are executable by a computer such as the processor 934.

The fabrication process 928 may be implemented by a fabrication system that is fully automated or partially automated. For example, the fabrication process 928 may be automated according to a schedule. The fabrication system may include fabrication equipment (e.g., processing tools) to perform one or more operations to form a semiconductor device. For example, deposit one or more materials, epitaxially grow one or more materials, conformally deposit one or more materials, apply a hardmask, apply an etching mask, perform etching, perform planarization, form a dummy gate stack, form a gate stack, deposit a conductive material, perform a chemical vapor deposition (CVD) process, perform a standard clean 1 type, or a combination thereof, as illustrative, non-limiting examples.

The fabrication system (e.g., an automated system that performs the fabrication process 928) may have a distributed architecture (e.g., a hierarchy). For example, the fabrication system may include one or more processors, such as the processor 934, one or more memories, such as the memory 935, and/or controllers that are distributed according to the distributed architecture. The distributed architecture may include a high-level processor that controls or initiates operations of one or more low-level systems. For example, a high-level portion of the fabrication process 928 may include one or more processors, such as the processor 934, and the low-level systems may each include or may be controlled by one or more corresponding controllers. A particular controller of a particular low-level system may receive one or more instructions (e.g., commands) from a high-level system, may issue sub-commands to subordinate modules or process tools, and may communicate status data back to the high-level system. Each of the one or more low-level systems may be associated with one or more corresponding pieces of fabrication equipment (e.g., processing tools). In a particular aspect, the fabrication system may include multiple processors that are distributed in the fabrication system. For example, a controller of a low-level system component of the fabrication system may include a processor, such as the processor 934.

Alternatively, the processor 934 may be a part of a high-level system, subsystem, or component of the fabrication system. In another aspect, the processor 934 includes distributed processing at various levels and components of a fabrication system.

Thus, the processor 934 may include processor-executable instructions that, when executed by the processor 934, cause the processor 934 to initiate or control formation of a semiconductor device. In a particular aspect, the processor 934 may perform operations including initiating formation of a first gate structure over a first FinFET device. The operations may include initiating formation of a second gate structure over a second FinFET device. The operations may include initiating deposition of a dielectric material in a region between the first FinFET device and the second FinFET device to form a dielectric region. The first gate structure and the second gate structure may be separated by the dielectric region. The operations may further include initiating formation of a metal contact having a surface that is in contact with the dielectric region, the first gate structure, and the second gate structure. One or more of the operations may be performed by controlling one of more deposition tools, such as a molecular beam epitaxial growth tool, a flowable chemical vapor deposition (FCVD) tool, a conformal deposition tool, or a spin-on deposition tool, one or more removal tools, such as a chemical removal tool, a reactive gas removal tool, a hydrogen reaction removal tool, or a standard clean 1 type removal tool, one or more etchers, such as a wet etcher, a dry etcher, or a plasma etcher, one or more dissolving tools, such as a developer or developing tool, one or more other tools, or a combination thereof.

The executable instructions included in the memory 935 may enable the processor 934 to initiate formation of a semiconductor device such as the integrated circuit 100 of FIG. 1. In a particular implementation, the memory 935 is a non-transitory computer readable medium storing processor-executable instructions that are executable by the processor 934 to cause the processor 934 to perform the above-described operations.

The die 936 may be provided to a packaging process 938 where the die 936 is incorporated into a representative package 940. For example, the package 940 may include the single die 936 or multiple dies, such as a system-in-package (SiP) arrangement. The package 940 may be configured to conform to one or more standards or specifications, such as Joint Electron Device Engineering Council (JEDEC) standards.

Information regarding the package 940 may be distributed to various product designers, such as via a component library stored at a computer 946. The computer 946 may include a processor 948, such as one or more processing cores, coupled to a memory 950. A printed circuit board (PCB) tool may be stored as processor executable instructions at the memory 950 to process PCB design information 942 received from a user of the computer 946 via a user interface 944. The PCB design information 942 may include physical positioning information of a packaged semiconductor device on a circuit board, the packaged semiconductor device corresponding to the package 940 including the integrated circuit 100 of FIG. 1.

The computer 946 may be configured to transform the PCB design information 942 to generate a data file, such as a GERBER file 952 with data that includes physical positioning information of a packaged semiconductor device on a circuit board, as well as layout of electrical connections such as traces and vias, where the packaged semiconductor device corresponds to the package 940 including the integrated circuit 100 of FIG. 1. In other implementations, the data file generated by the transformed PCB design information 942 may have a format other than a GERBER format.

The GERBER file 952 may be received at a board assembly process 954 and used to create PCBs, such as a representative PCB 956, manufactured in accordance with the design information stored within the GERBER file 952. For example, the GERBER file 952 may be uploaded to one or more machines to perform various steps of a PCB production process. The PCB 956 may be populated with electronic components including the package 940 to form a representative printed circuit assembly (PCA) 958.

The PCA 958 may be received at a product manufacture process 960 and integrated into one or more electronic devices, such as a first representative electronic device 962 and a second representative electronic device 964. For example, the first representative electronic device 962, the second representative electronic device 964, or both, may include or correspond to the wireless communication device 800 of FIG. 8. As an illustrative, non-limiting example, the first representative electronic device 962, the second representative electronic device 964, or both, may include or correspond to a communications device, a fixed location data unit, a mobile location data unit, a mobile phone, a cellular phone, a satellite phone, a computer, a tablet, a portable computer, or a desktop computer. Alternatively or additionally, the first representative electronic device 962, the second representative electronic device 964, or both, may include a set top box, an entertainment unit, a navigation device, a personal digital assistant (PDA), a monitor, a computer monitor, a television, a tuner, a radio, a satellite radio, a music player, a digital music player, a portable music player, a video player, a digital video player, a digital video disc (DVD) player, a portable digital video player, any other device that stores or retrieves data or computer instructions, or a combination thereof, into which the integrated circuit 100 of FIG. 1 is integrated. As another illustrative, non-limiting example, one or more of the electronic devices 962 and 964 may include remote units, such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Aspects of the disclosure may be suitably employed in any device which includes active integrated circuitry including memory and on-chip circuitry.

A device that includes the integrated circuit 100 of FIG. 1 may be fabricated, processed, and incorporated into an electronic device, as described in the illustrative process 900. One or more aspects disclosed with respect to FIGS. 1-8 may be included at various processing stages, such as within the library file 912, the GDSII file 926, and the GERBER file 952, as well as stored at the memory 910 of the research computer 906, the memory 918 of the design computer 914, the memory 950 of the computer 946, the memory of one or more other computers or processors (not shown) used at the various stages, such as at the board assembly process 954, and also incorporated into one or more other physical implementations such as the mask 932, the die 936, the package 940, the PCA 958, other products such as prototype circuits or devices (not shown), or any combination thereof. Although various representative stages are depicted with reference to FIGS. 1-9, in other implementations fewer stages may be used or additional stages may be included. Similarly, the process 900 of FIG. 9 may be performed by a single entity or by one or more entities performing various stages of the process 900.

Although one or more of FIGS. 1-9 may illustrate systems, apparatuses, and/or methods according to the teachings of the disclosure, the disclosure is not limited to these illustrated systems, apparatuses, and/or methods. One or more functions or components of any of FIGS. 1-9 as illustrated or described herein may be combined with one or more other portions of another of FIGS. 1-9. Accordingly, no single implementation described herein should be construed as limiting and implementations of the disclosure may be suitably combined without departing form the teachings of the disclosure.

Those of skill would further appreciate that the various illustrative logical blocks, configurations, modules, circuits, and algorithm steps described in connection with the implementations disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the disclosure herein may be implemented directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description is provided to enable a person skilled in the art to make or use the disclosed implementations. Various modifications to these implementations will be readily apparent to those skilled in the art, and the principles defined herein may be applied to other implementations without departing from the scope of the disclosure.

Thus, the present disclosure is not intended to be limited to the implementations shown herein but is to be accorded the widest scope possible consistent with the principles and novel features as defined by the following claims.

What is claimed is:

1. An apparatus comprising:
    a first gate structure coupled to a first fin field effect transistor (FinFET) device;
    a second gate structure coupled to a second FinFET device, the first gate structure and the second gate structure separated by a dielectric region; and
    a metal contact having a first surface that is in physical contact with each of a surface of the dielectric region, a surface of the first gate structure, and a surface of the second gate structure, wherein the first gate structure is electrically coupled to the second gate structure via the metal contact.

2. The apparatus of claim 1, wherein a target drive strength of the first FinFET device, a target drive strength of the second FinFET device, or a combination thereof, is based on a width of the dielectric region.

3. The apparatus of claim 1, wherein a target drive strength of the first FinFET device, a target drive strength of the second FinFET device, or a combination thereof, is based on a position of the dielectric region relative to the first gate structure and the second gate structure, and wherein each of the first gate structure, the metal contact, and the second gate structure is in physical contact with a different surface of the dielectric region.

4. The apparatus of claim 1, further comprising the first FinFET device and the second FinFET device, wherein the first gate structure, the second gate structure, and the metal contact are included in a static random access memory (SRAM) device, and wherein the first gate structure is in physical contact with at least two sides of the first FinFET device and the second gate structure is in physical contact with at least two sides of the second FinFET device.

5. The apparatus of claim 1, further comprising a shallow trench isolation (STI) layer, wherein the first FinFET device and the second FinFET device comprise pass-gate transistors, and wherein each of the first gate structure, the metal contact, the second gate structure, and the STI layer is in physical contact with a different surface of the dielectric region.

6. The apparatus of claim 5, further comprising a word line coupled by a via to the metal contact.

7. The apparatus of claim 6, further comprising one or more bit lines, wherein the metal contact is included in a contact layer, wherein the word line is included in a metal-1 layer, and wherein the one or more bit lines are included in a metal-2 layer.

8. The apparatus of claim 5, wherein the first FinFET device is included in a first static random access memory (SRAM) cell, and wherein the second FinFET device is included in a second SRAM cell that is adjacent to the first SRAM cell.

9. The apparatus of claim 5, wherein the dielectric region is substantially the same distance from the first FinFET device and the second FinFET device.

10. The apparatus of claim 1, wherein the first FinFET device comprises a pull-up transistor, and wherein the second FinFET device comprises a pull-down transistor.

11. The apparatus of claim 10, wherein a second surface of the metal contact is adjacent to the dielectric region, the second surface opposite to the first surface.

12. The apparatus of claim 10, wherein the first FinFET device and the second FinFET device are included in a same static random access memory (SRAM) cell.

13. The apparatus of claim 10, wherein a distance between the first FinFET device and the dielectric region is less than a distance between the second FinFET device and the dielectric region.

14. The apparatus of claim 10, wherein a distance between the first FinFET device and the dielectric region is greater than a distance between the second FinFET device and the dielectric region.

15. An apparatus comprising:
    first means for storing a first data value, the first means for storing comprising a first fin field effect transistor (FinFET) device, wherein the first FinFET device is coupled to a first gate structure;
    second means for storing a second data value, the second means for storing comprising a second FinFET device, wherein the second FinFET device is coupled to a second gate structure, the first gate structure and the second gate structure separated by a dielectric region; and
    means for electrically coupling the first gate structure to the second gate structure, wherein the means for electrically coupling has a surface that is in physical contact with each of a surface of the dielectric region, a surface of the first gate structure, and a surface of the second gate structure.

16. The apparatus of claim 15, wherein a target drive strength of the first FinFET device, a target drive strength of the second FinFET device, or a combination thereof, is based on a width of the dielectric region and a position of the dielectric region.

17. The apparatus of claim 15, wherein the first FinFET device and the second FinFET device comprise pass-gate transistors, wherein a word line is coupled to the means for electrically coupling, wherein the means for electrically coupling is included in a contact layer, and wherein the word line is included in a higher metal layer.

18. The apparatus of claim 15, wherein the first FinFET device comprises a pull-up transistor, wherein the second FinFET device comprises a pull-down transistor, and wherein the means for electrically coupling has a second surface that is opposite to the surface and that is adjacent to the dielectric region.

19. The apparatus of claim 15, wherein the first means for storing comprises the first gate structure, wherein the second means for storing comprises the second gate structure, wherein the means for electrically coupling comprises a metal contact, and wherein the first means for storing, the second means for storing, and the means for electrically coupling are included in an integrated circuit.

20. The apparatus of claim 15, wherein the first FinFET device is included in a first static random access memory (SRAM) cell, wherein the second FinFET device is included in a second SRAM cell that is adjacent to the first SRAM cell, and further comprising:
    third means for storing a third data value, the third means for storing comprising a third FinFET device, wherein the third FinFET device is coupled to a third gate structure;
    fourth means for storing a fourth data value, the fourth means for storing comprising a fourth FinFET device, wherein the fourth FinFET device is coupled to a fourth gate structure, the third gate structure and the fourth gate structure separated by a second dielectric region; and second means for electrically coupling the third gate structure to the fourth gate structure, wherein the second means for electrically coupling has a second surface that is in physical contact with each of a surface of the second dielectric region, a surface of the third gate structure, and a surface of the fourth gate structure, and wherein the third FinFET device and the fourth FinFET device are included in a same SRAM cell.

* * * * *